United States Patent [19]
Hida et al.

[11] Patent Number: 4,841,134
[45] Date of Patent: Jun. 20, 1989

[54] IC CARD

[75] Inventors: Yoshiaki Hida; Satoshi Ishihara; Seiji Take; Masao Gogami; Toshiyuki Suzuki, all of Tokyo, Japan

[73] Assignee: Dai Nippon Insatsu Kabushika Kaisha, Tokyo, Japan

[21] Appl. No.: 889,277

[22] Filed: Jul. 25, 1986

[30] Foreign Application Priority Data

| Jul. 27, 1985 | [JP] | Japan | 60-166450 |
| Sep. 5, 1985 | [JP] | Japan | 60-196168 |
| Nov. 8, 1985 | [JP] | Japan | 60-250152 |
| Feb. 21, 1986 | [JP] | Japan | 61-036719 |
| Mar. 4, 1986 | [JP] | Japan | 61-047023 |

[51] Int. Cl.<sup>4</sup> ............................................. G06K 19/02
[52] U.S. Cl. .................................... 235/488; 235/492
[58] Field of Search ............................... 235/488, 492

[56] References Cited

U.S. PATENT DOCUMENTS 4,463,971  8/1984  Hoppe et al. .................. 235/488 X
4,617,216 10/1986  Haghiri-Tehrani et al. ... 235/488 X
4,719,140  1/1988  Hara et al. ..................... 235/488 X

*Primary Examiner*—David L. Trafton
*Attorney, Agent, or Firm*—Arnold, White & Durkee

[57] ABSTRACT

The IC card of the present invention comprises an IC card comprising an IC module embedded in a card substrate, said IC card having a reinforcing sheet layer laid in the planar direction of the card so as to cover at least the peripheral portion of the boundary between the card substrate and the IC module, and/or has a reinforcing member comprising at least a part of the side portion of said IC module extended in the outer circumferential direction, and it is excellent in mechanical strength and flexibility against bending of card.

22 Claims, 20 Drawing Sheets

IC CARD

BACKGROUND OF THE INVENTION

This invention relates to an IC card and an IC module mounted or built therein

In recent years, studies have been progressed about cards called as chip card, memory card, micom card or electronic card (hereinafter referred to merely as IC card) equipped with an IC chip such as microcomputer (hereinafter called MPU), memory, etc.

Such an IC card, due to its greater memory capacity as compared with the magnetic card of the prior art, is intended to memorize the history of deposits and savings in place of a bank book in bank businesses or to memorize the trading history such as shopping in the credit businesses.

Such an IC card generally comprises a center core in the shape of a card in which an IC module is to be embedded and an oversheet for enhancing mechanical strength of the card laminated on one surface or both surfaces of the center core.

Since the IC module built in such an IC card of the prior art is formed of a material having no elasticity, breaks or cracks may form at the boundary portion between the IC module and the card substrate when the card is strongly bent, or in an extreme case the IC module may fall off or become separated from the card.

SUMMARY OF THE INVENTION

The present invention addresses and solves the above drawback. Its object is to provide an IC card with an IC module built there sufficient mechanical strength and flexibility against breakage or cracks during being. In order to accomplish such an object, the IC card according to the first embodiment of the present invention comprises an IC card comprising an IC module embedded in a card substrate, said IC card having a reinforcing sheet layer laid in the planar direction of the card so as to cover at least the peripheral portion of the boundary between the card substrate and the IC module.

Further, the IC card according to the second embodiment of the present invention comprises an IC card comprising an IC module comprising an IC chip, a circuit substrate, etc., embedded in an IC module substrate built in a card substrate, said IC module having a reinforcing member comprising at least a part of the side portion of said IC module substrate extended in the outer circumferential direction.

Also, the IC card according to the present invention may be a combination of the two embodiments as specified above. That is, the IC card of the present invention can be provided with both of the above reinforcing sheet and the above reinforcing member to obtain synergetically excellent mechanical strength and flexibility.

DETAILED DESCRIPTION OF THE INVENTION

Figure 1A:
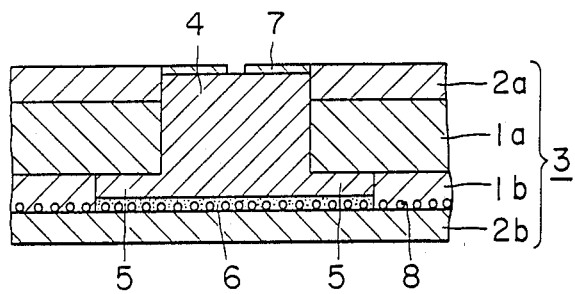
FIGS. 1A~1C, FIG. 28, FIGS. 30~31, FIGS. 33~42 and FIG. 44 are each sectional views of the IC card of the present invention.
Figure 2:
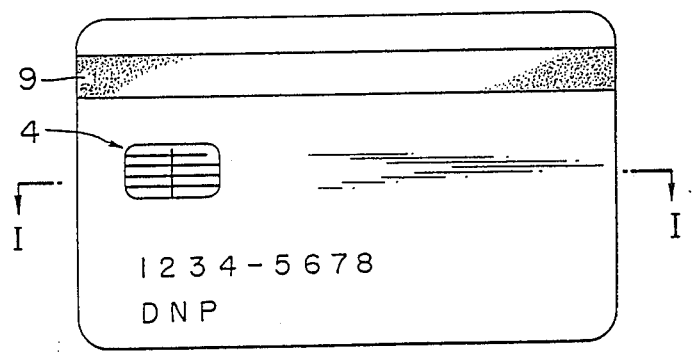
FIGS. 2, 29 and 32 are each plan views of the IC card of the present invention.

The present invention is described in more detail below by referring to its preferred embodiments. FIG. 2 is a plan view of an IC card and, in the case of this embodiment, an IC module 4 and a magnetic recording portion 9 are formed in the card. FIGS. 1A(a)~(d) are cross-sectional views taken along the I—I line in FIG. 2, respectively.

More specifically, as shown in FIG. 1A(a), the IC card according to the preferred embodiment of the present invention has an IC module 4 embedded through an adhesive layer 6 in a card substrate 3 comprising a laminate of center cores 1a, 1b and oversheets 2a, 2b, and the IC module 4 has a reinforcing member 5 comprising the side portion of the IC module substrate partially extended with respect to the outer circumferential direction. Further, between the center core 1b and the oversheet 2b, a reinforcing sheet layer 8 is formed by laying e.g., a mesh layer therebetween. The symbol 7 is a terminal for electrical connection to the external device.

The position at which the reinforcing member 5 of the IC module is formed may be provided at the bottom of the IC module as shown in FIG. 1A(a), or otherwise at the middle stage as shown in FIG. 1A(b), or at the upper stage portion as shown in FIG. 1A(c), or further at both the upper stage portion and the bottom as shown in FIG. 1A(d).

Figure 3A:
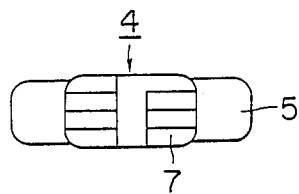
FIGS. 3 and 4 are each plan views of the IC module to be used in the IC card of the present invention.
Figure 3B:
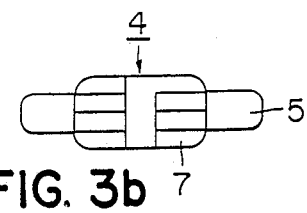
Figure 3C:
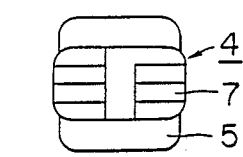
Figure 3D:
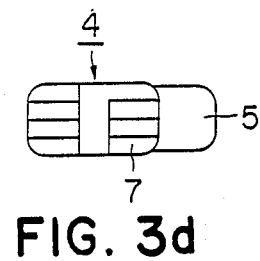

Also, the IC module may be shaped so that the reinforcing member 5 may protrude in a specific direction as shown in the plane views of FIG. 3 (FIG. 3(a), (b), (c) and (d), or alternatively shaped in a sword guard (FIG. 3(e)) For obtaining an excellent reinforcing effect, it is preferred that the reinforcing member 5 be formed in a shape so that it may have a greater area toward the portion with a greater flex coefficient of the card.

Figure 4A:
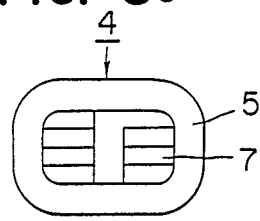
Figure 4A:
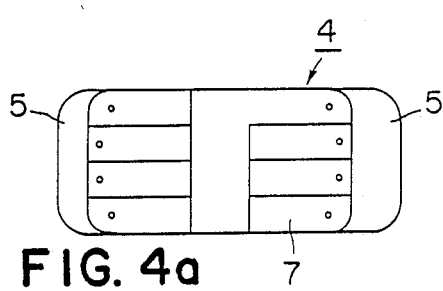
Figure 4B:
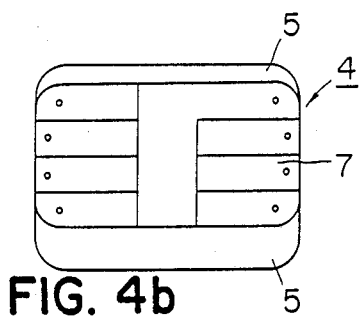

FIGS. 4(a), (b) and (c) are examples of IC modules having reinforcing members with such particularly preferable shapes. In FIG. 4(a), the reinforcing member 5 is provided so as to extend out the left and right sides of the IC module 4, and still have greater area on the right direction side (central portion direction of card). FIG. 4(b) is an example when the reinforcing member is extended in the upper and lower directions, and have a greater area on the lower part direction part.

Figure 4C:
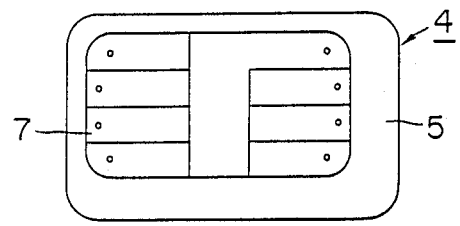

Further, FIG. 4(c) is an example when the reinforcing member is provided in shape of a sword guard, which is enlarged in the right direction and the lower direction. In these examples, it is assumed that the IC modules are embedded at the position shown in FIG. 2.

Also, in the IC card of the present invention, a reinforcing sheet layer 8 having a high shear strength and flexibility and/or for high elasticity can be formed by laying the sheet layer in the planar direction of the card. In this embodiment, it is important that no crack or breaking should occur at the boundary portion between the card substrate 3 and the IC module 4 even when the IC card may be bent under the conditions shown below.

(a) Bending in the longer side direction

At a deflection amount of 2 cm, the card is bent in the face direction and the back direction, respectively, at the rate of 30 times/min. for 100 times or more (preferably 250 times or more).

(b) Bending in the shorter side length At a deflection amount of 1 cm, the card is bent in the face direction and the back direction, respectively, at the rate of 30 times/min. for 100 times or more (preferably 250 times or more)

In order that no crack or breaking should occur at the boundary portion between the card substrate and IC module even in the bending test carried out under the conditions as mentioned above, the reinforcing sheet should preferably be composed of a material having high shear strength and flexibility with recovery when bent or a material having sufficient elasticity capable of absorbing the shearing stress concentrated at the boundary portion between the card substrate and the IC module comprising a rigid body and diffusing its stress when bent under the above conditions. Particularly, materials having high shear strength, flexibility and elasticity may preferably be used.

Figure 1B:
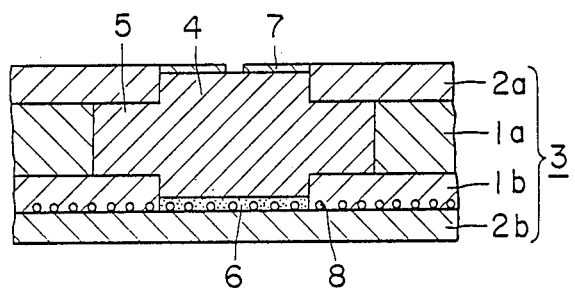
Figure 1C:
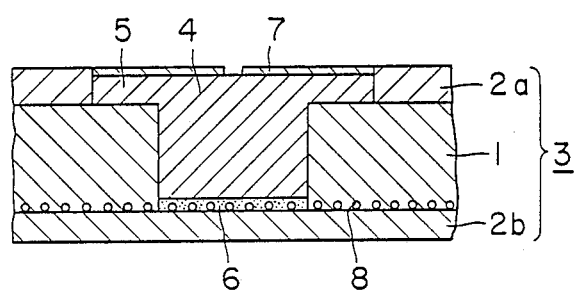
Figure 1D:
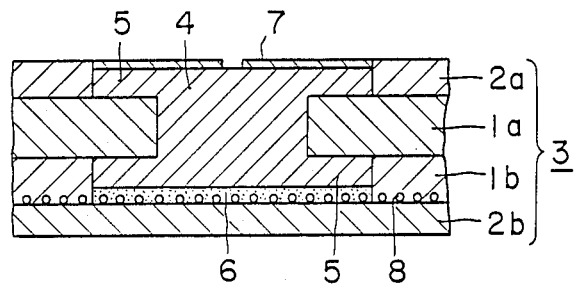
Figure 1B:
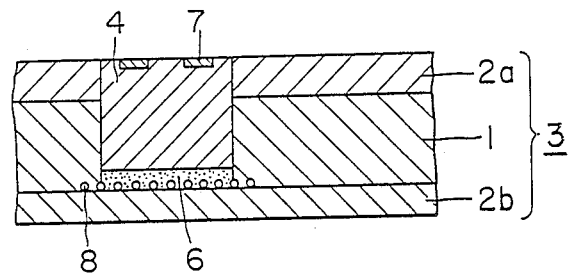
Figure 1C:
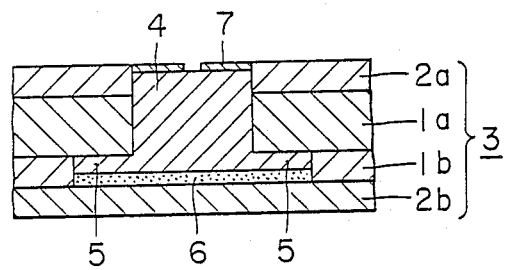

FIG. 1C is a cross-sectional view of another embodiment of the present invention. The IC card according to this embodiment has no reinforcing sheet layer but the IC module 4 embedded therein has a reinforcing member 5. The IC card shown in FIG. 1B has no reinforcing member in IC module 4 but has a reinforcing sheet layer 8 (e.g., a mesh sheet) laid in the planar direction of the IC card. In this embodiment, the reinforcing sheet layer 8 is laid between an oversheet 2b and an IC module 4 so as to cover at least the peripheral portion of the boundary between the IC module and the card substrate.

Reinforcing sheet layer

The reinforcing sheet layer to be laid is not particularly limited in material or shape, provided that mechanical strength and flexibility as mentioned above can be imparted to the IC card. For example, it can be a mesh layer comprising network-shaped sheets as enumerated below, unwoven fabric, continuous sheet, rubber, thermoplastic elastomer, rubbery adhesive layer, tacky layer and others.

(i) Mesh-like sheet

This can be constituted of a knitted or woven fabric in shape of a net or a porous sheet, and as its material, it is possible to use nylon (nylon 66, such as, nylon 6, nylon 11, nylon 610, nylon 4, nylon 7, nylon 9, nylon 12 polyester, acryl, vinylon, rayon, polypropylene, polyvinylidene chloride, polyethylene, polyurea type, polystyrene type, polyurethane type, polyfluoroethylene type (Teflon), etc.; cellulose type such as acetate, triacetate, ethyl cellulose, etc.; semi-synthetic fibers such as chlorinated rubber, hydrochloric acid rubber, etc.; natural fibers such as wool, cotton, silk, etc., glass fiber, carbon fiber, metal mesh or perforated sheets of various plastic films or metals, etc.

By using a reinforcing sheet layer of such a surfaces of the mesh layer can be well fused through the openings of the mesh whereby adhesion therebetween can be easily effected. Also there is also another advantage is that the increase in thickness of the card can be reduced by using the mesh layer. Also, there is no trouble forming embossed letters even when a mesh layer is provided.

(ii) Unwoven fabric

A sheet obtained by arranging fibers according to a suitable method in a thin cotton shape or a mat shape and bonding mutually the fibers through fusion force of an adhesive, etc., can be used.

(iii) Continuous sheet

Metal foil or a plastic sheet such as of polyester, polyimide, polypropyrene, nylon, polyethylene, EVA, acryl, polycarbonate, polyvinylidene chloride, acetate, polyurethane, Teflon, polyvinyl alcohol, polystyrene, etc.

(iv) Rubber sheet

Sheet of natural rubber (NR), styrene-butadiene rubber (SBR), butadiene rubber (BR), butyl rubber, ethylene-propylene-diene-methylene-polymer (EPDM), chloroprene rubber (CR), nitrile rubber (NBR), chlorosulfonated polyethylene (CSM), polysulfide type rubber (T), urethane rubber (U), epichlorohydrin rubber (CHC), acryl rubber (AM, ANN), fluorine rubber (FPM), silicone rubber (SI), etc.

(v) Thermoplastic elastomer

Sheet of thermoplastic SBR type elastomer, thermoplastic polyurethane, etc.

(vi) Rubbery adhesive

Polychloroprene type, nitrile rubber type, regenerated rubber type, butadiene-styrene copolymer (SBR) type or natural rubber type adhesive, etc.

(vii) Adhesive or tacky sheet having an adhesive layer on one surface or both surfaces of sheet substrate:

An adhesive or tacky sheet having a layer of rubbery adhesive, tackifier, thermoplastic resin adhesive, composite adhesive such as polyvinyl formal phenolic, etc., a thermosetting resin adhesive such as epoxy resin, etc., formed on at least one surface of a substrate sheet such as a mesh-like sheet of the above (i), unwoven fabric of (ii), continuous sheet of (iii), rubber sheet of (iv), etc.

The reinforcing sheet layer to be laid may have any desired size and shape, but it is necessary to form the reinforcing sheet layer so that at least the peripheral portion of the boundary between the card substrate and the IC module may be substantially covered.

Reinforcing sheet (1)

For example, the reinforcing sheet may be a sheet substrate comprising the above mesh having a network structure formed by laying therein.

Figure 5A:
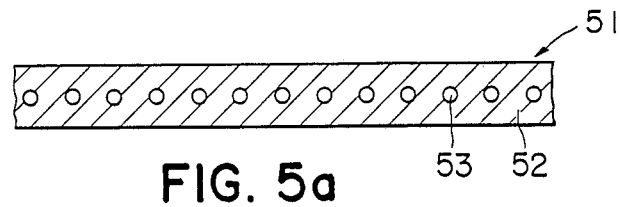
FIGS. 5, 20, 21, 23 and 24 are each sectional views of reinforcing sheets (or oversheets)

As shown in the cross-sectional view in FIG. 5(a), it (51) has a mesh 53 as described above laid in a sheet substrate 52.

For the sheet substrate in this case, a plastic known in the art can be used and may be selected depending on the desired use of the card.

The thickness of the mesh may differ depending on kind of the card or material to be reinforced, but usually a mesh with 10 to 500 μm thickness may be used. The mesh degree (number of mesh openings per 1 inch)

preferably should be 50 mesh/inch or more. If the mesh degree is less than 50 mesh/inch, the mesh becomes weaker in strength (particularly flexural strength), thereby reducing the fracture preventing effect achieved when forming a laminate.

Figure 5B:
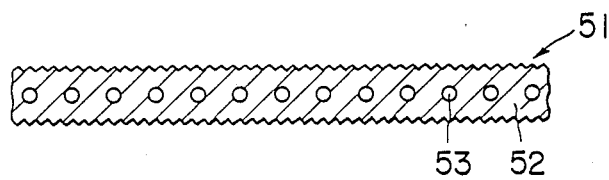

Also, the reinforcing sheet to be used in the present invention may have a fine unevenness formed on the surface of the sheet substrate 52 as shown in the cross-sectional view in FIG. 5(b). Thus, by applying a matte working on the substrate surface, air escape during pressing when preparing a card can be improved, whereby generation of unevenness (so called lick) on the surface can be advantageously prevented.

Such a reinforcing sheet can be prepared according the methods as described below.

(a) Method by hot press

For example, there is the method in which a mesh is embedded into plastic sheet by carrying out hot press with a mesh sandwiched between two sheets of plastic sheet, or the method in which a mesh is embedded within a plastic sheet by carrying out hot press with a mesh placed on one surface of one plastic sheet.

(b) Laminating method by use of an adhesive

For example, there is the method in which a mesh coated with an adhesive is sandwiched between two sheets of a plastic sheet and a pressure is applied thereon. The adhesive available in this case may include those known in the art such as rubber type adhesive, tackifier, thermoplastic resin adhesive, composite adhesive, thermosetting resin adhesive, etc.

(c) Further, a method which combines the above methods (a) and (b) may also be used.

Reinforcing sheet (2)

Figure 6A:
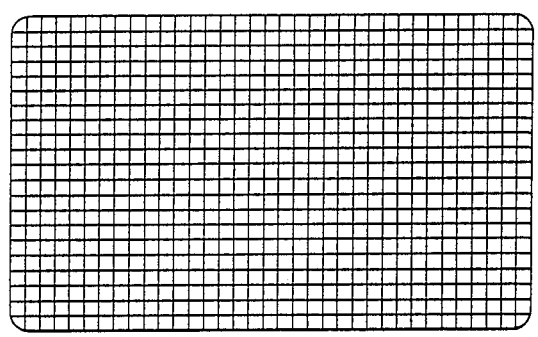
FIGS. 6 and 7 are each plan views of cards comprising reinforcing sheets.
Figure 6B:
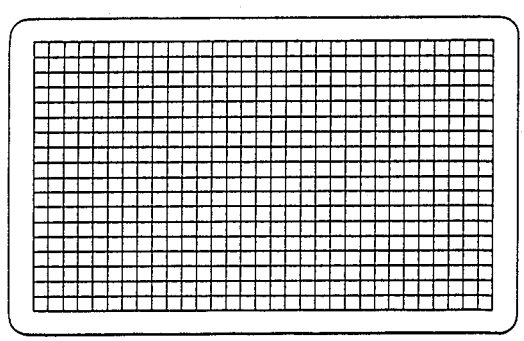

When the mesh sheet is laid on the whole surface of the card substrate, it may be laid so as to cover the whole surface in the planar direction of the card as shown in the plan view of FIG. 6 (FIG. 6(a)), or alternatively it may be formed so as to give brims at the peripheral portion thereof (FIG. 6(b)).

Figure 7:
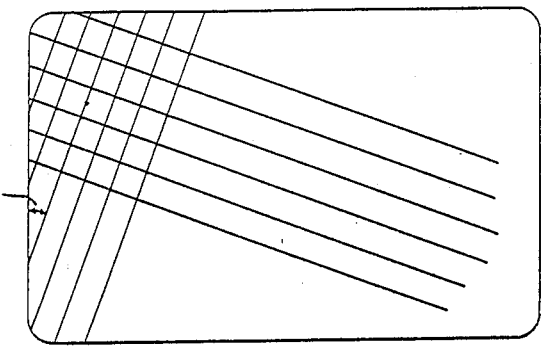

Further, as shown in FIG. 7, by laying the mesh so that the direction of the network of the mesh may be slanted relative to the side of the card, there are advantages that (a) the bending strength of the card can be further improved, and also that (b) no fray of the mesh will come out from the cut face when it is punched out into a card size in the final step.

The sharp angle α between the direction of the fiber constituting the network of the mesh and the side of the card in this case may be within the range of $0 < \alpha < 90°$, preferably $10° < \alpha < 80°$, and more preferably $\alpha = $ about 45°.

The thickness of the mesh may differ depending on the kind of the card or the material to be reinforced, but it is preferably 10 to 500 μm. The mesh degree (number of openings per 1 inch) should preferably be 50 mesh/inch or more. If the mesh degree is less than 50 mesh/inch, the strength (particularly flexural strength) becomes weaker.

Reinforcing sheet (3)

The IC card of the prior art involves the following problems, namely:

(a) the resin material used in the mold of IC module of the prior art is generally black, and besides the oversheet is constituted of a transparent material, whereby on the back face of the IC card (namely the face on the side opposite to the terminal for connection) the shade of the IC module portion can be seen, this creating a great obstacle when forming visible information such as printing on the back face of card and also causing the problem of lowering aesthetic characteristic of the card; and (b) since the existence of an IC module can be easily grasped from the back face side of the IC card, it is also disadvantageous in prevention of forgery, of card.

To avoid the above problems, an embodiment is characterized by having an opaque white oversheet laminated through a reinforcing sheet which also functions as the shielding layer on the face opposite to the terminal for connection of the IC module.

Such a shielding layer may also function as an adhesive layer. For example, the shielding layer may be formed of an opaque white sheet such as a white polyester and adhesive layers laminated on both surfaces thereof. The shielding layer may have a color identical or similar to that of a card substrate and/or an IC module.

Further, in this case, for enhancing the shielding effect, the component materials of an IC module, for example, the material of an IC module or the resin for its mold can be made of materials having a color identical or similar to those of a card substrate (e.g., opaque white).

Reinforcing sheet (4)

In this embodiment, the reinforcing sheet (adhesive sheet) has polyolefin type adhesive layers laminated on both surfaces of the plastic film. The kinds of the adhesive layers on both surfaces may be either the same or different.

As the plastic film, a polyester, polycarbonate, cellulose type polyimide film, etc., may be used, but in respect of reinforcing effect, a polyester film is particularly preferred. The plastic film may have a thickness preferably within the range of from 3 to 50 μm. If the thickness is less than 3 μm, a good reinforcing effect cannot be obtained, while a thickness over 50 μm is disadvantageously too thick.

As the material for the adhesive layer in type hot adhesive may be preferably used especially an ethylene-acrylic acid copolymer adhesive, and ethylene-vinyl acetate copolymer adhesive. The thickness of the adhesive layer may be 1 to 80 μm in view of obtaining good adhesive force and giving no disadvantage to the card thickness.

In addition, by making the plastic film opaque white or a color similar to that of the IC module, there is created the effect of shielding the shade of IC module portion when the IC card is observed from the backside, whereby printing and aesthetic characteristic on the backside of the card as well as the effect of preventing forgery can be improved. As the method for whitening, there may be employed the method in which a white pigment is kneaded into a film material or the method in which a white layer is separately coated.

IC module (1)

Next, a specific example of an IC module to be built in the IC card of the present invention is described together with its preparation example.

Figure 8A:
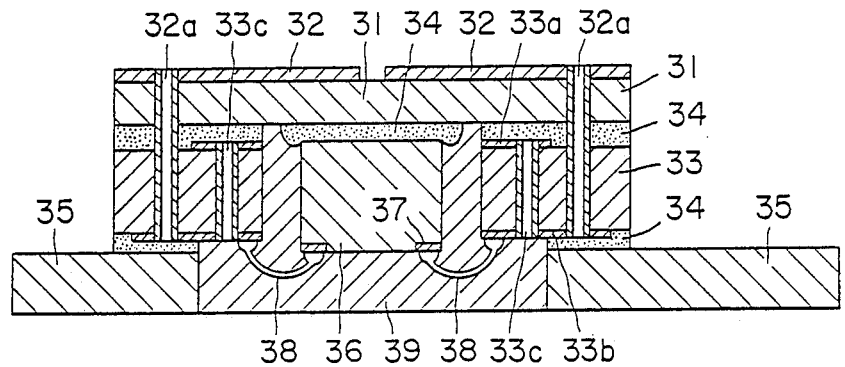
FIGS. 8A~8C and FIGS. 9~16 are each sectional views of the IC module.

FIG. 8A is a sectional view of the IC module according to one embodiment.

First, on the surface of an IC module substrate 31 comprising a glass epoxy film with a thickness of about 0.1 mm (film prepared by impregnating a glass cloth with an epoxy resin and curing the resin), etc., an electrode pattern 32 for connecting terminal with a thickness of 30 μm is formed. The electrode pattern 32 can be formed by patterning to a desired pattern according to photoetching by use of a film having a copper foil laminated on the IC module substrate layer 31, and then applying Ni and Au plating thereon.

Subsequently, a circuit pattern layer 33 having a hole for arranging an IC chip and at least two layers of circuit patterns formed thereon is prepared. This circuit pattern layer 33 can be formed by using, for example, an insulating film (e.g., glass epoxy film) having copper foils formed on both surfaces thereof with a thickness of about 18 μm to form circuit patterns 33a, 33b in two face and back layers by patterning to desired circuit patterns according to photoetching, etc., and further providing a through-hole 33c for taking conduction at a desired position between the face and back circuit patterns 33a and 33b.

For formation of the through-hole 33c, first the portions other than the through-hole working portion are covered with a resist and subsequently, hole-opening working at the through-hole portion, plating working internally of the through-hole and removal of resist are performed in this order.

After formation of the through-hole, Ni plating and Au plating are applied at the circuit portion.

After plating of the circuit portion, the resist is removed and hole-opening working is performed at the portion where IC chip is to be provided.

Next, with registration between the IC module substrate layer as prepared above and the circuit pattern layer, the respective layers are plastered through an adhesive layer 34 to be integrated. The plastering step may be also conducted by hot pressure adhesion through, for example, semi-cured epoxy resin film.

Subsequently, for conduction between the electrode pattern 32 for connecting terminal and the circuit pattern 33b in the circuit pattern layer 33, a through-hole 32a is provided at a desired position. The through-hole 32a, can be formed in the same manner as formation of the above through-hole 33c.

As the next step, a sealing frame layer 35 is prepared for prevention of flow-out of the resin during resin molding of IC module. In this embodiment, the extended portion of the sealing frame layer 35 constitutes the reinforcing member (in FIG. 8A, having greater area in the right direction). The sealing frame layer 35 is formed by providing minimum extent of holes for exposing circuit portion for wiring an IC chip on an insulating substrate (thickness about 0.2 mm) of the same material as used for the above IC module substrate layer and the circuit pattern layer.

Then, the above sealing frame layer 35 is plastered through an adhesive layer 34 where the circuit pattern 33b of the laminated of the above IC module substrate layer and the circuit pattern layer is formed to be integrated. It is also possible to form an adhesive layer on the extended portion of the sealing frame layer 35 constituting the reinforcing member.

On the circuit substrate for IC module thus prepared, an IC chip 36 is mounted by use of an adhesive 34. More specifically, as shown in FIG. 8A, the IC chip 36 becomes supported on the IC module substrate layer 31. Next, the bonding portion 37 of the IC chip is connected to the circuit pattern 33b with a conductor 38 according to the wire bonding system, etc. This may be also practiced according to the face-bonding system without use of a wire and, in that case, a thin IC module can be obtained. After wiring between the IC chip 36 and the circuit pattern 33b is effected, molding is carried out by filling a resin for mold 39 such as an epoxy resin, etc., so as to cover the IC chip and the wiring portion. During molding, the surface of the resin 39 is made to coincide in height with the surface of the sealing frame layer 35. By curing of the mold resin, formation of IC module having a reinforcing member is completed.

Figure 9:
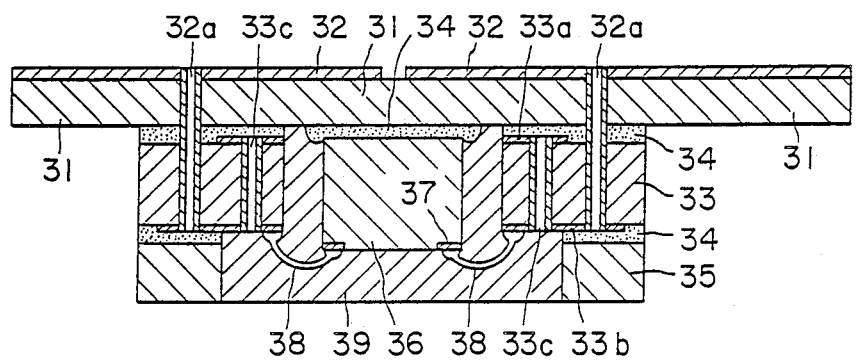
Figure 10:
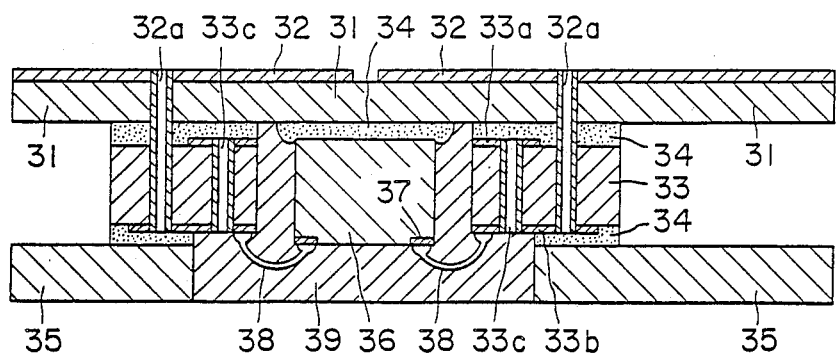
Figure 11:
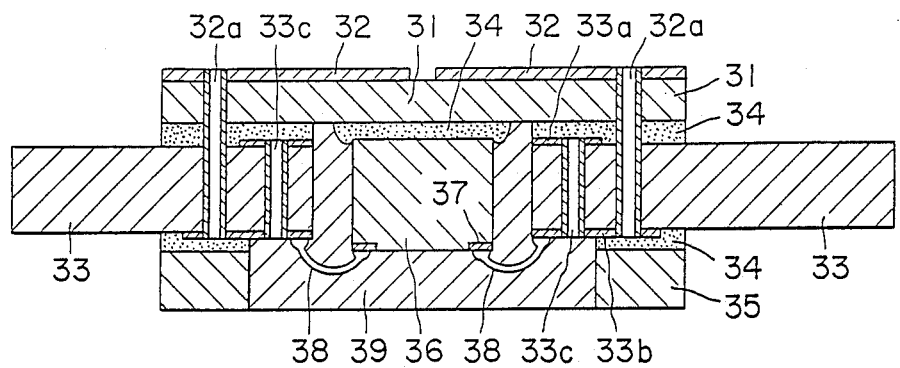

It is also possible to constitute a reinforcing member by extending the IC module substrate layer 31 according to the same method as described above (FIG. 9), further possible to constitute a reinforcing member by extending both of the IC module substrate layer 31 and the sealing frame layer (FIG. 10), and further an embodiment of extending the circuit pattern layer 33 can be used (FIG. 11). In any of the above cases, an adhesive layer may be formed on the surface of the extended portion constituting the reinforcing member.

Figure 12:
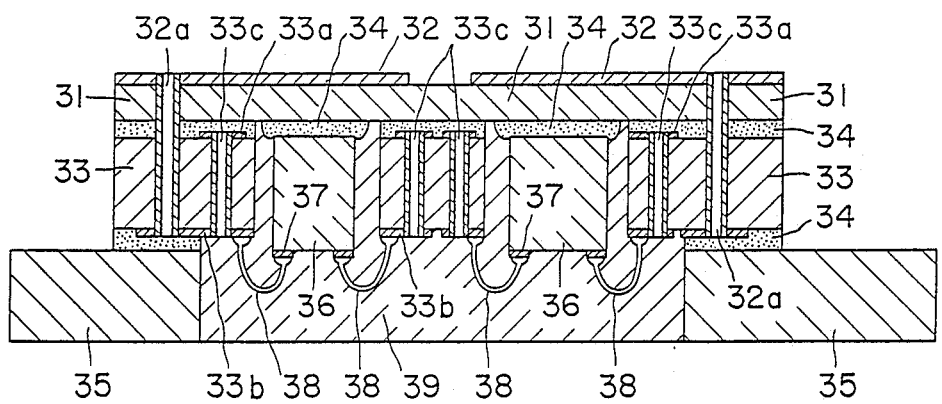

Everyone of the above examples is an example of using a single IC chip, but a reinforcing member can be also constituted according to the same embodiment as the above FIG. 8A for an IC module having a plurality of IC chips built therein. For example, FIG. 12 is an embodiment of the case when an IC module corresponding to FIG. 8A was formed with two-chip constitution. Also in this embodiment, it is possible to form an adhesive layer on the extended portion of the sealing frame layer constituting the reinforcing member.

Figure 13:
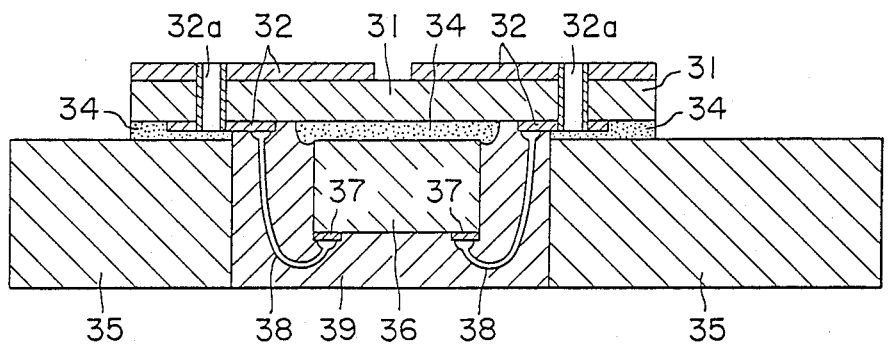

FIG. 13 is an embodiment when the IC module is constituted with two-layer constitution and different from the three-layer constitution as shown in FIG. 8A~FIG. 12 in that no circuit pattern layer 33 is employed. The embodiment shown in FIG. 13 constitutes the reinforcing member (extended portion) with the sealing frame layer 35, but alternatively a reinforcing member may be formed by extending the IC module substrate layer 31 as shown in the above embodiment in FIG. 9. Also in this case, an adhesive layer may be formed on the surface of the extended portion constituting the reinforcing member.

IC module (2)

Figure 14:
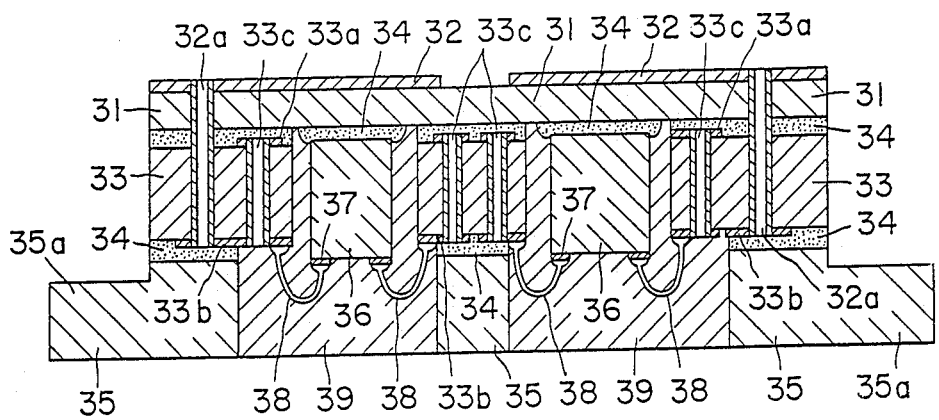

The IC module shown in FIG. 14 is a modification of the IC module shown in FIG. 12.

That is, in this specific embodiment, the reinforcing member 35a is formed by extending the sealing frame layer 35. And, this reinforcing member is extended toward the outer circumferential portion so that a stepped difference may be formed at the sealing frame layer 35. Therefore, as compared with the case when no such stepped difference is provided, the stress imposed on the bonded portion (34) between the circuit pattern layer 33 and the sealing frame layer 35 can be reduced, whereby mechanical strength and flexibility against bending of the IC module can be further enhanced. Such a stepped diference can be formed by cutting working, etc.

Figure 15A:
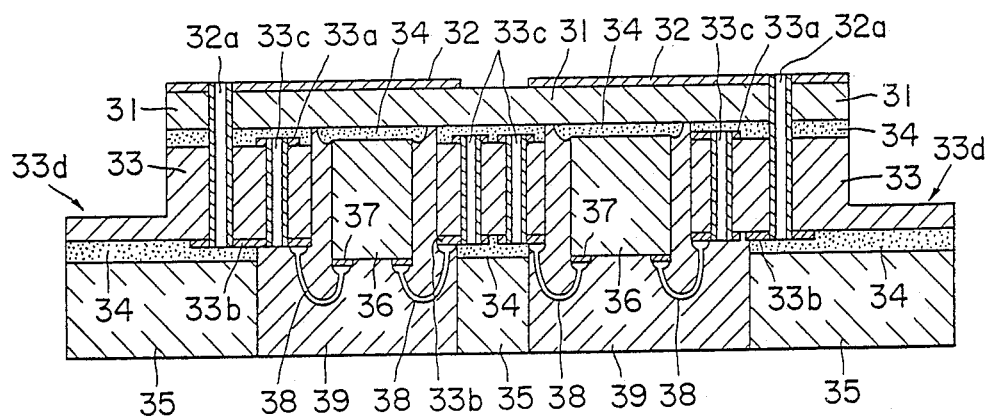
Figure 15B:
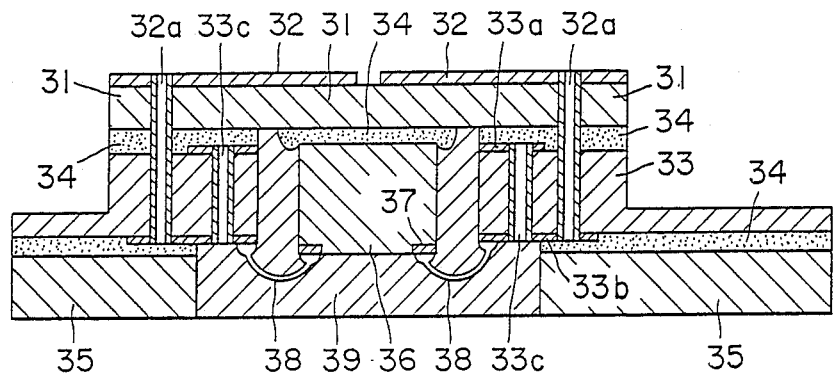

The embodiment shown in FIGS. 15A and 15B is another modification and, in this case, the reinforcing member 33d is formed with provision of a stepped difference at the circuit pattern layer 33.

Figure 15C:
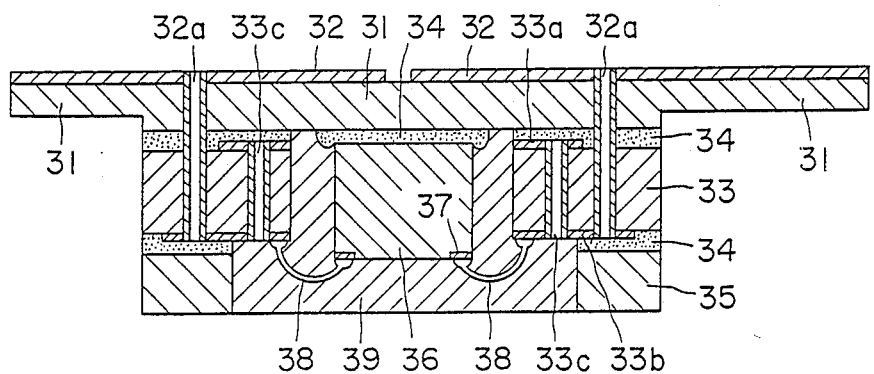

Other than those as described above, as shown in FIG. 15C, a reinforcing member having a stepped difference at the IC module substrate layer may be also formed.

IC module (3)

In this embodiment, the specific feature resides in applying smoothening working on the backface of the IC module (the face on the side at which it is embedded in the card substrate).

That is, in this embodiment, after filling (and curing) of the mold resin in the embodiment (1), the backface (the side of sealing frame layer) of the module is worked by smoothening (or mirror finishing) according to polishing or other methods. As the method for such smoothening working, it is possible to perform cutting working by means of a bite, milling, etc., or grinding by means of grind stone, file or horning, lapping, discharging working, etc. Further, it is possible to employ the method in which the surface is smoothened by scraping off the resin before the sealing resin is completely cured.

Figure 16:
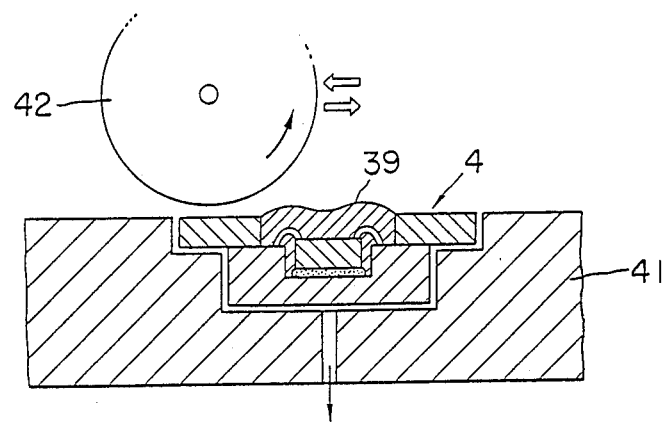

FIG. 16 is a sectional view when smoothening working is performed by means of a grinder. As shown in this figure, an IC module 4 filled with a resin for mold 39 is placed in a module fixing implement 41 and fixed under suction by vacuum evacuation. Then, by carrying out smoothening working by grinding the surface of the sealed resin by means of a rotary grind stone 42, the preparation step of the IC module is completed.

Therefore, in this embodiment, since smoothening working is applied by a grinder, etc., on the sealed surface after resin sealing of the IC chip portion, it is not necessary to perform cumbersome operations such as controlling the amount of the sealed resin at high precision during filling of the resin or controlling the fluidity of the resin as practiced in the prior art.

Further, the IC module obtained as described above is worked to a smooth surface (mirror surface) on the side embedded in the card substrate, and therefore the module thickness precision can be improved, whereby generation of unevenness, sink mark, etc., on the outer surface of the card after molding of IC card particularly at the peripheral portion of module, and destruction of IC chip can be prevented to improve yield of the IC card.

IC module (4)

Figure 17:
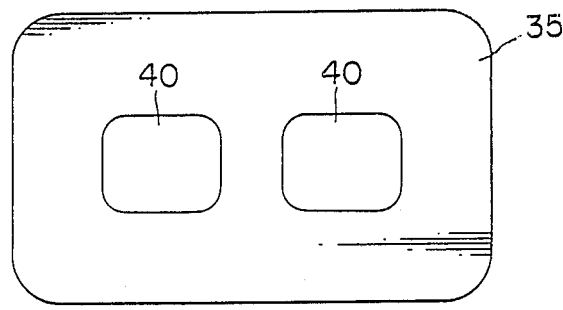
FIGS. 17 and 18 are each plan views of sealing frame layers.
Figure 18:
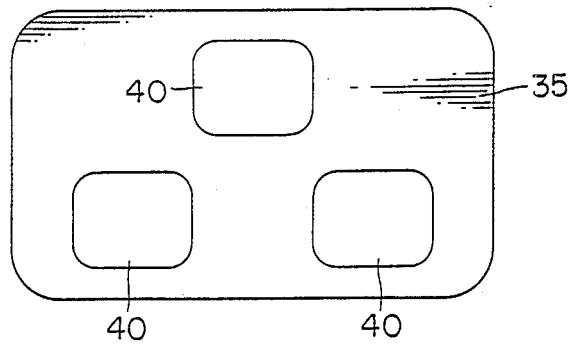

When the IC module has a plurality of IC chips (for example, one chip micom and memory chip) mounted thereon, it is preferred that the sealing frame layer 35 should have the independent windows of shapes for permitting the respective IC chips 36 to extend therethrough, respectively, as shown in FIG. 14 and FIG. 15A. FIG. 17 is a plan view of the sealing frame layer 35 in this case. Also, FIG. 18 is a plan view of a sealing frame layer in an embodiment including three IC chips. Thus, since independent windows 40 corresponding to the respective IC chips are formed in the sealing frame layer 35 in the IC module of the present invention (namely, since the sealing frame layer exists between the respective windows), the following effects can be obtained.

(a) As compared with one having no sealing frame between the IC chip embedding holes, mechanical strength and flexibility of IC module against external force such as bending, twisting, etc., can be improved, whereby IC chip and IC module can be excellently prevented from breaking.

(b) Since the amount of the resin for sealing used in the preparation step can be made smaller, and also the stress at the interface between the resin nd IC chip created by temperature difference can be made smaller, warping of an IC module or any other deleterious influence on an IC chip can be reduced.

IC module (5)

Figure 8B:
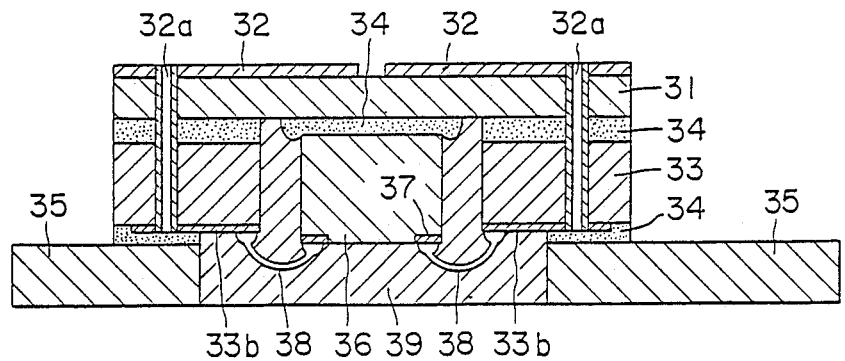

The IC module shown in FIG. 8B is a modification of the IC module shown in FIG. 8A.

In this embodiment, a circuit pattern 33b is formed on only one side of a circuit pattern layer 33 (i.e., on the sealing frame layer 35 side). Accordingly, in this embodiment, it is not necessary to form through-holes 33c in the circuit pattern layer 33 as in the embodiment shown in FIG. 8A. A circuit pattern 33b (a dummy pattern which does not contact electrically with an external terminal) can be formed on a side of the circuit pattern layer 33 (on the IC module substrate 31 side) for imparting hardness to the IC module.

Other components and methods for producing this IC module are the same as the above embodiment (1).

IC module (6)

Figure 8C:
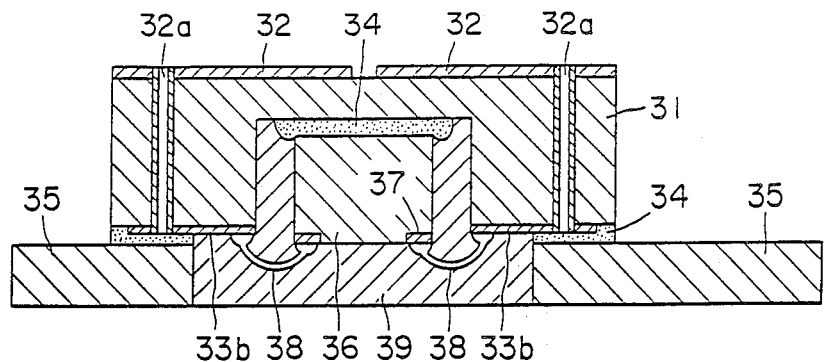

The IC module shown in FIG. 8C is a modification of the IC module shown in FIG. 8B.

In this embodiment, on one surface of an IC module substrate 31, e.g., a glass epoxy film with a thickness of about 0.3 mm, is formed an electrode pattern 32, and on the other surface of an IC module substrate 31, is formed a circuit pattern 33b. Next, a cavity for mounting an IC chip 36 is formed by boring at a depth of about 0.2 mm. Other, components and methods for producing IC module are the same as the above embodiment (1).

The present invention is described in more detail by referring to the following examples, but the present invention is not limited to these examples.

EXAMPLE A-1 (PREPARATION OF REINFORCING SHEET, TEST EXAMPLE)

A mesh sheet was coated and impregnated with an adhesive to prepare an adhesive sheet as shown in FIG. 5(a).

Such an adhesive sheet can be obtained by coating, for example, a polyester mesh "T-305S" (305 mesh-/inch; NBC Kogyo Co.) with a nitrile rubber type adhesive by means of a dip coater at a proportion of 50 g/m² (dry state).

The thickness in this case was about 70μ. The adhesive sheet thus obtained was found to be heat-sealable, and the adhesive sheet was sandwiched between two sheets of an unstretched rigid vinyl chloride resin sheet with a thickness of 0.2 mm, followed by hot pressing at 120° C. under 30 kg/cm² for 15 minutes to obtain a reinforced laminate of a rigid vinyl chloride sheet with a thickness of 0.45 mm.

A rigid vinyl chloride sheet with a thickness of 0.45 mm not containing the above adhesive sheet as comparative example and the reinforced rigid vinyl chloride sheet obtained in the above example were subjected to the test of folding endurance by means of an M.I.T. type folding endurance tester under the load of 1.5 kg with a test strip width of 15 mm. The test results are shown in Table A-1 below in terms of the number of folding before the test strip is cut.

TABLE A-1

| | Folding endurance |
|---|---|
| Example A-1 | More than 40,000 times |

TABLE A-1-continued

| | Folding endurance |
|---|---|
| Comparative Example | 1,800 times |

As is apparent from the above results, the rigid vinyl chloride sheet laminate with the adhesive sheet of this example exhibited excellent folding endurance.

EXAMPLE B-1 (PREPARATION OF REINFORCING SHEET, TEST EXAMPLE)

Figure 19:
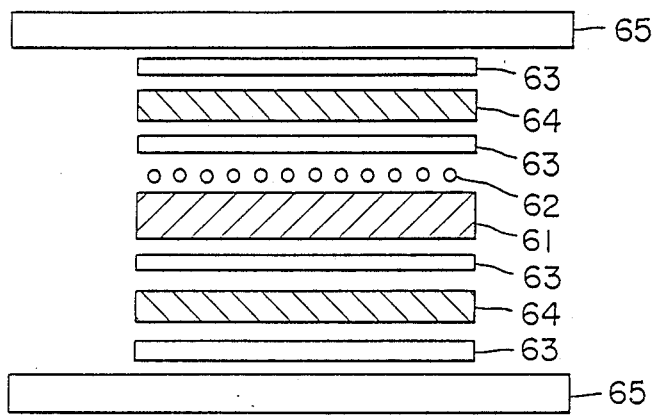
FIGS. 19 and 22 are each sectional views of reinforcing sheet layers to be produced in accordance with the present invention.
Figure 20:

As shown in a cross-sectional view in FIG. 19, a mesh 62 comprising Tetron "T-270T" (270 mesh/inch; NBC Kogyo Co.) was superposed on a substrate 61 comprising a transparent rigid vinyl chloride sheet with a thickness of 100 μm, and further a stainless steel plate (luster plate) 63, a chip ball (cushioning material) 64, surface plates of a pressing machine 65 were further superposed thereon, to carry out hot pressing under a flat pressure (150° C., 20 minutes, 40 kg/cm$^2$). As a result, a sheet for reinforcement having a mesh 62 in the surface layer of the substrate 61 as shown in FIG. 20 was obtained.

Together with a conventional rigid vinyl chloride sheet with a thickness of 100μ containing no mesh as comparative example, folding endurance test was conducted by means of an M.I.T. type folding endurance tester under the load of 1.5 kg with a test strip width of 15 mm. The results are shown in Table B-1 below in terms of the number of folding before the test strip is cut.

TABLE B-1

| | Folding endurance |
|---|---|
| Example B-1 | More than 30,000 times |
| Comparative Example | About 1,500 times |

Thus, the rigid vinyl chloride sheet containing mesh of this example exhibited very excellent folding

EXAMPLE B-2 (THE SAME AS ABOVE)

Figure 21:
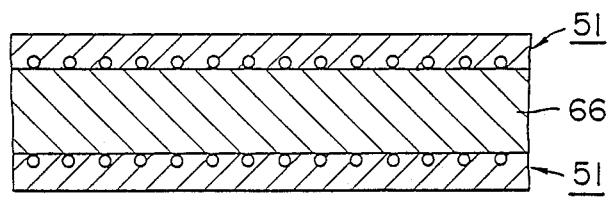

Using the reinforcement sheet prepared in the same manner as Example B-1, a plastic card with a thickness of 0.76 mm was prepared according to the method as described below. As shown in the cross-sectional view in FIG. 21, sheet for reinforcement 51 (oversheet) were superposed on both upper and lower sides of a center core (vinyl chloride sheet) 66 with a thickness of 0.56 mm applied with a desired printing with the mesh surface being inner side, and hot pressing was carried out under the same conditions as Example B-1 (150° C., 20 minutes, 40 kg/cm$^2$), followed by punching out in a card size to prepare a plastic card with a thickness of 0.76 mm. It is also possible to form a magnetic recording layer (not shown) on the reinforcing sheet 51 (oversheet), if necessary.

As a comparative example, a plastic card with a thickness of 0.76 mm was prepared in the same manner by use of a rigid vinyl chloride sheet (oversheet) with a thickness of 100 and μ containing no mesh.

From these cards, samples embossed on all the lines at the positions determined by JIS and those without emboss were prepared, and, at a deflection amount of 14.5 mm height in the shorter side direction, bending test (30 times/minute) was practiced for 3,000 times for embossed samples and 5,000 times for samples without emboss. The results are shown in Table B-2 below.

TABLE B-2

| | Without emboss | Embossed |
|---|---|---|
| Example B-2 | Without fracture of card | Without fracture of card |
| Comparative example | Fracture generated in card after about 1,500 times | Fracture generated in card after about 1,200 times |

As is apparent from the above results, the plastic card prepared from a vinyl chloride oversheet containing mesh has bending strength by far superior to the card containing no mesh.

EXAMPLE B-3 (THE SAME AS ABOVE)

Figure 22:
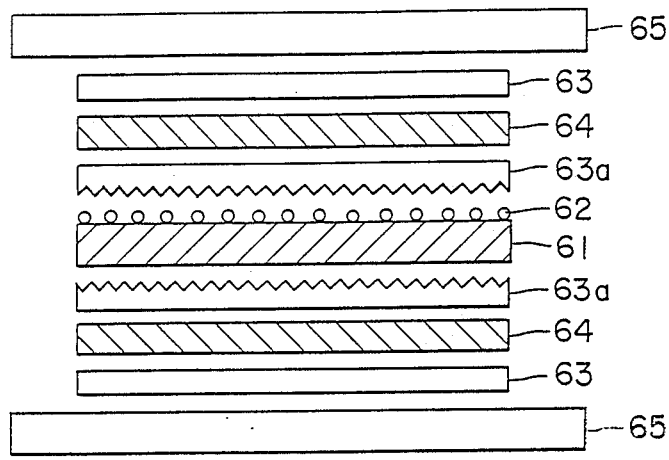
Figure 23:
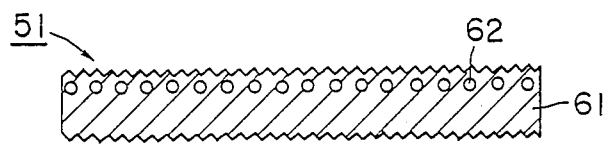

As shown in the cross-sectional view in FIG. 22, a mesh 62 comprising Tetron "T-150T" (150 mesh/inch; NBC Kogyo Co.) was superposed on a sheet substrate 61 comprising a transparent rigid vinyl chloride sheet with a thickness of 100 μm, and further stainless steel plates 63a subjected to matte working by a sand matte were superposed thereon to carry out hot pressing in the same manner as Example B-1. As a result, a sheet for reinforcement 51 applied with matte working on both surfaces of the substrate 61 as shown in FIG. 23 was obtained. Matte working can be applied on any desired surface by replacing the above stainless steel plates 63a with the desired plate.

By use of the reinforcing sheet obtained, the same evaluation as Example B-1 and the evaluation of the card prepared in the same manner as Example B-2 were conducted. As the result, folding endurance was found to be 30,000 times or more and, in the card bending test, good performance was exhibited without fracture after 3,000 times for embossed sample and 5,000 times for sample without emboss. At the same time, air escape during press lamination was also good, whereby a card with excellent appearance and luster could be obtained without lick and sink on the card surface.

EXAMPLE B-4 (THE SAME AS ABOVE)

With a nylon mesh "N-270T" (270 mesh/inch; NBC Kogyo Co.) sandwiched between the two sheets of a vinyl chloride sheet with a thickness of 40μ, a vinyl chloride sheet containing mesh subjected to matte working on both surfaces was prepared in the same manner as Example B-3.

These were subjected to evaluation according to the same methods as Examples B-1 and B-2. As the result, the same excellent performance as the evaluation result in Example B-3 was exhibited.

EXAMPLE B-5 (THE SAME AS ABOVE)

Figure 24:
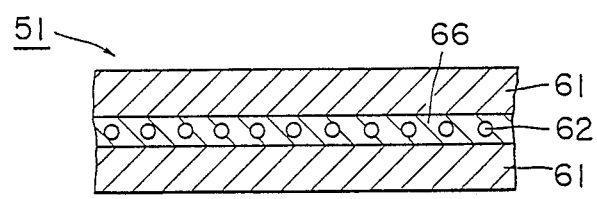
Figure 25A:
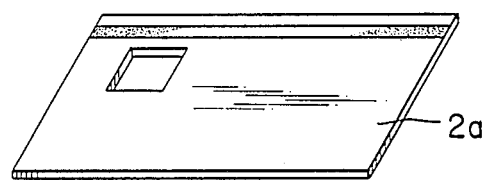
FIGS. 25~27 are each perspective views of construction members of the IC card of the present invention.
Figure 25B:
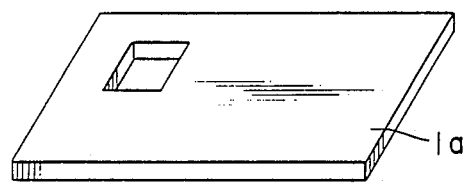
Figure 25C:
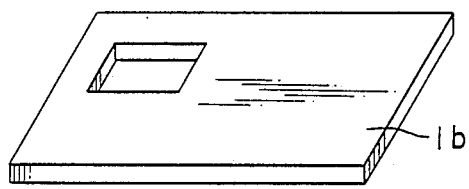
Figure 25D:
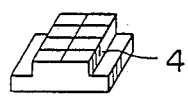
Figure 25E:
Figure 25F:
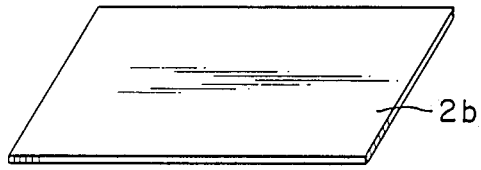
Figure 26A:
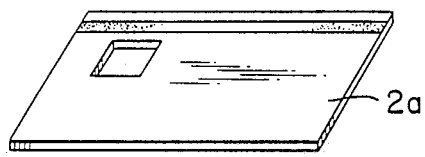
Figure 26B:
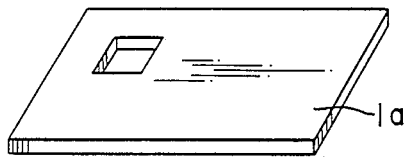
Figure 26C:
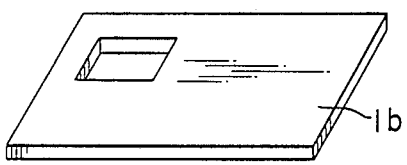
Figure 26D:
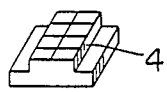
Figure 26E:
Figure 26F:
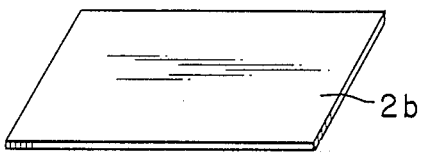
Figure 27A:
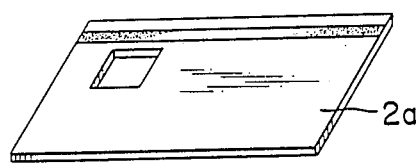
Figure 27B:
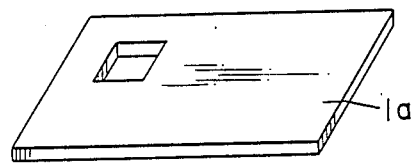
Figure 27C:
Figure 27D:
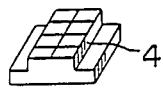
Figure 27E:
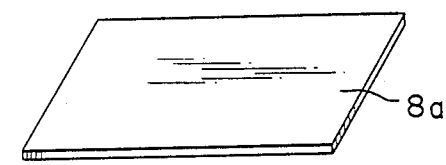
Figure 27F:
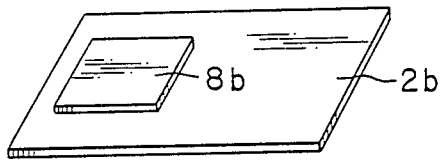

As shown in the cross-sectional view in FIG. 24, a polyester-isocyanate type adhesive 66 having terminal OH groups "AD-502" (produced by Toyo Morton Co.) was applied to an amount of 5 g/m$^2$ on one surface of a sheet substrate 61 compising a vinyl chloride sheet with a thickness of 40 μ by use of a dry laminator, dry laminated on a mesh 62 (Tetron mesh "T-200S" (200 mesh/inch; NBC Kogyo Co.)), and the laminate was wound up with a releasing paper interposed. Further, on the mesh surface of this film, the same adhesive was applied to an amount of 5 g/m$^2$, and a vinyl chloride sheet with a thickness of 40 μ was dry laminated thereon to prepare a sheet for reinforcement with a structure having a mesh sandwiched between two sheets of vinyl chloride sheet with a thickness of 40μ.

When the same evaluations were conducted according to the methods as Examples B-1 and B-2 by use of the sheet for reinforcement obtained, excellent performance was exhibited similarly as the evaluation results in Example B-3.

EXAMPLE B-6 (THE SAME AS ABOVE)

A rigid vinyl chloride sheet with a thickness of 40μ was coated on one surface by a roll coater with a urethane type adhesive to an amount of 4 g/m², and two sheets of the thus coated sheet were subjected to hot pressing in the same manner as Example B-3 with the adhesive coated surfaces facing innerward and with a Tetron mesh "T-150S" (150 mesh/inch; NBC Kogyo Co.) sandwiched therebetween to prepare a sheet for reinforcement which is matte on both surfaces or one surface.

When the same evaluations were conducted according to the methods as Examples B-1 and Example B-2, excellent reinforcing performance was exhibited similarly as the evaluation results in Example B-3.

EXAMPLE C-1 (LAYING OF MESH SHEET)

In this example, a mesh comprising a network-shaped sheet (for example, polyester mesh "T-270T" (270 mesh/inch; NBC Kogyo Co.) is formed by laying between the center core and the oversheet. As shown in FIG. 6(a), the mesh is laid over the whole card in this example. In this case, the card has a thickness of 0.76 mm.

Next, the method for preparation of the plastic card according to the above example is to be explained. First, a mesh is sandwiched between a center core applied with a necessary printing and an oversheet, and the composite under this state is subjected to hot pressing (150° C., 25 kg/cm², 20 minutes) and then punched out in a card size to complete a plastic card. It is also possible to form a magnetic recording layer on the oversheet, if necessary. The mesh may be previously embedded on one surface of the oversheet by hot press, etc., or alternatively a laminate laminated with an adhesive, etc., may be used.

The mesh surface may be on the card surface side, or within the oversheet.

As comparative example, a plastic card with a thickness of 0.76 mm having the same laminated composition as this example except for containing no mesh was prepared. From these cards, samples having formed embossed letters on all the lines at the positions determined by JIS and samples having formed no such letter were prepared and, at a deflection amount of 14.5 mm height in the shorter side direction, bending tests (30 times/min.) were practiced 3,000 times for embossed samples and 5,000 times for non-embossed samples. The results are shown in Table C-1 below.

TABLE C-1

|  | Without emboss | Embossed |
| --- | --- | --- |
| Example C-1 | Without fracture of card | Without fracture of card |
| Comparative | Fracture generated in | Fracture generated in |

TABLE C-1-continued

|  | Without emboss | Embossed |
| --- | --- | --- |
| example | card after about 1,500 times | card after about 1,200 times |

These results show that the plastic card prepared with a vinyl chloride oversheet containing mesh has a bending strength by far superior to that of the card containing no mesh.

EXAMPLE C-2 (THE SAME AS ABOVE)

In this example, a mesh is formed by laying between center cores. The mesh material in this case may be a nylon 200 mesh/inch "N-270T" (NBC Kogyo Co.). As shown in FIG. 6(a), mesh as formed over the whole card in this example. In this embodiment, the card has a thickness of 0.76 mm.

The mesh may be embedded previously on one surface in the center core by a hot press, or alternatively a laminate laminated with an adhesive may be used. Also, as shown in FIG. 6(b), it may have a shape having no mesh layer at the edge portions so that the mesh may fringe the four corners of the card.

Samples of this card of application with emboss on all the lines at positions determined by JIS and without application of emboss were prepared, and the bending test (30 times/minute) was practiced at a deflection amount of 14.5 mm height at shorter side direction 3,000 times for embossed samples and 5,000 times for samples without emboss. The results are shown in Table C-2 shown below.

TABLE C-2

|  | Without emboss | Embossed |
| --- | --- | --- |
| Example C-2 | Without fracture of card | Without fracture of card |
| Comparative example (as described in Example C-1) | Fracture generated in card after about 1,500 times | Fracture generated in card after about 1,200 times |

These results show that the plastic card prepared with a vinyl chloride oversheet containing mesh has a bending strength by far superior to that of the card containing no mesh.

EXAMPLE C-3 (THE SAME AS ABOVE)

In this example, a plastic card with the same laminate composition with which as Example C-1 was prepared. However, the direction in which the mesh was laid was made at an angle of $\alpha=45°$ as shown in FIG. 7.

When this laminated structure is punched out into a card size, fraying of the fiber of mesh from the card edge can be prevented, and further with respect to fracture by the bending text, excellent performance was exhibited similarly as Example C-1.

EXAMPLE C-4 (THE SAME AS ABOVE)

The card in this example was made to have a shape of the mesh laid between the center core and the oversheet as shown in FIG. 6(b), by cutting the mesh so that the four corners of the card were just fringed by the mesh.

Next, the method for preparation of the plastic card according to the above example is explained. First, a mesh is sandwiched between a center core applied with necessary printing and coated on both surfaces with urethane type adhesive for lamination according to the method such as roll coating, gravure coating, etc., and an oversheet, and the composite under this state is subjected to hot pressing (110° C., 25 kg/cm², 20 minutes) and then punched out in a card size to complete a plastic card. It is also possible to form a magnetic recording layer on the oversheet, if necessary.

Samples of this card with application of emboss on all the lines at positions determined by JIS and without application of emboss were prepared, and the bending test (30 times/minute) was practiced at a deflection amount of 14.5 mm height at shorter side direction 3,000 times for embossed samples and 5,000 times for samples without emboss. The results are shown in Table C-3 shown below.

TABLE C-3

|  | Without emboss | Embossed |
|---|---|---|
| Example C-3 | Without fracture of card | Without fracture of card |
| Comparative example (as described in Example C-1) | Fracture generated in card after about 1,500 times | Fracture generated in card after about 1,200 times |

These results show that the plastic card prepared with a vinyl chloride oversheet containing mesh has a bending strength by far superior to that of the card containing no mesh. Also, when punched out into a card size, fraying of the mesh fiber from the card edge can be prevented.

EXAMPLE D-1 (PREPARATION OF IC CARD)

FIGS. 25(a)~(f) are perspective views of the respective construction members of the IC card of the present invention.

First, according to a transfer method, an ethylene-acrylic acid copolymer hot adhesive "AC2000" (Mitsubishi Yuka Fine Co.) is formed on one surface of a white polyester film (Diafoil W-100, 25 μm thickness; Diafoil Co.), and further on the other surface, an ethylene-vinyl acetate copolymer hot adhesive (EC1200; Mitsubishi Yuka Fine Co.) was formed to a thickness each of 120 μm, to prepare an adhesive sheet (reinforcing sheet) 8.

Next, the adhesive sheet 8 was cut out so as to have a greater area than the IC module 4 and adhered tentatively on a hot plate so that the adhesive layer AC2000 was oriented toward the IC module side. Subsequently, this was laminated together with center cores 1a and 1b, and the oversheet 2a provided with holes at the IC module embedding portions and the oversheet 2b, and integrated according to the hot press method to obtain an IC card.

The IC card thus obtained was found to be free from the problems such as peel-off of IC module during card bending or generation of cracks of the oversheet, because both good adhesiveness and reinforcing effect could be exhibited. Also, due to use of the white polyester, it was excellent in the shielding effect of IC module.

EXAMPLE B-6 (THE SAME AS ABOVE)

As shown in FIG. 26, first on both surfaces of a polyester film (Lumilar, 16 μm thickness; Toray Co.), a hot adhesive (EC1200; Mitsubishi Yuka Fine Co.) was formed according to roll coating to a thickness of 20 μm, to prepare an adhesive sheet 8a.

Next, an IC module was inserted into the center cores 1a, 1b, and the oversheet 2a provided with holes at the IC module corresponding portions, and, with arrangement of the adhesive sheet 8a having the same shape as the card on the backside, the oversheet 2b was further superposed thereon, followed by hot pressing to prepare an IC card.

When the IC card thus obtained was subjected to bending test (according to ISO), there occurred no problem such as peel-off of IC module edge or crack of the oversheet.

EXAMPLE E-1 (PREPARATION OF IC CARD)

This embodiment is formed according construction as FIG. 25(a)~(f). First, after die bonding and wire bonding of an IC chip on a white multilayer substrate, resin sealing was carried out with a white mold resin (ME868; Amicon Co.)

Next, on both surfaces of a white polyester film (25 μm thickness), hot adhesive layer (EC1200; Mitsubishi Yuka Fine Co.) was formed to a thickness each of 20 μm to obtain a reinforcing sheet 8 which also functions as the shielding layer.

Subsequently, after the shielding layer (reinforcing) sheet 8 was tentatively plastered on the backside of the IC module 4, this was laminated together with center cores 1a and 1b, and oversheet 2a provided with holes at the IC module embedding portions and oversheet 2b, followed by integration according to the hot press method to obtain an IC card. In this case, as the oversheet 2b, an opaque white oversheet containing titanium white was employed.

When the IC card thus obtained was observed from the backside, no shade of the IC module portion was recognized.

EXAMPLE E-2 (THE SAME AS ABOVE)

FIG. 27(a)~(f) are perspective views of the respective construction members of the IC card of the present invention according to another embodiment.

The IC module 4 and the reinforcing sheet 8a prepared were the same as those in the foregoing Example E-1. Further, a shielding layer 8b comprising a white ink layer was formed on the oversheet 2b, following otherwise the same procedure as Example E-1 to prepare an IC card.

The IC card obtained was found to be excellent in shielding the IC module portion and aesthetic characteristic, and it has also been rendered possible to print on the backside portion of the IC module.

In the following Examples F-1 to F-13, the embodiments as shown in FIG. 15A and FIG. 4(a) were used as the IC module, but, all the IC modules disclosed in the specification are available for use in the following examples.

EXAMPLE F-1 (PREPARATION OF IC CARD)

Figure 28:
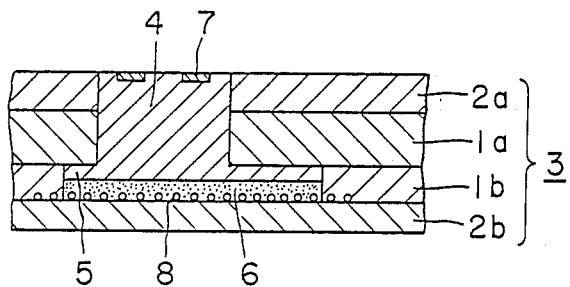

As shown in the cross-sectional view in FIG. 28, the IC card according to this example has an IC module 4 arranged through an adhesive layer 6 in the card substrate 3 comprising a laminate of the center cores 1a, 1b, and the oversheets 2a, 2b. The symbol 7 is a terminal for electrical connection to external portion. And, in this example, a reinforcing sheet layer 8 comprising a mesh of a network-shaped sheet (e.g., polyester mesh "T270T"; NBC Kogyo Co.) is formed by laying between the center core 1b and the oversheet 2b.

Figure 29:
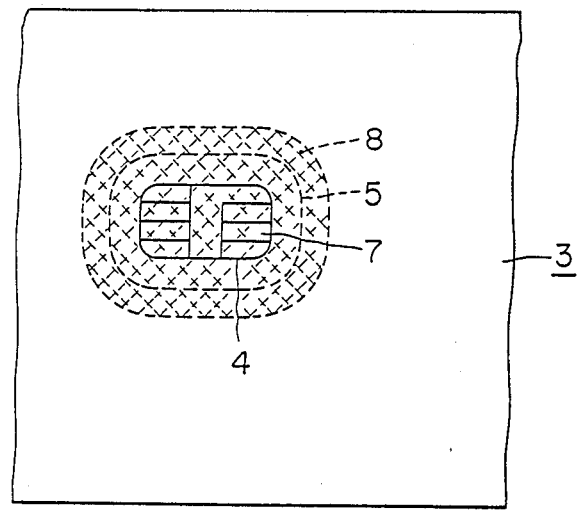

As shown in the plan view in FIG. 29, in this Example, a reinforcing sheet layer 8 having slightly greater area and shape than the IC module 4 is laid. The card thickness (including the module portion) in this case is 0.70 to 0.81 mm.

Next, the method for preparation of the IC card according to the above example is discussed.

First, holes for embedding the IC card are formed at the predetermined portions of the center cores 1a, 1b and the oversheet 2a. The center cores 1a and 1b are coated on both surfaces with an urethane type adhesive for lamination by roll coating method, gravure coating method, etc. Here, the hole provided at the center core 1b is formed corresponding to the shape of the reinforcing member.

Next, the oversheet 2a, the center cores 1a, 1b are superposed in this order, simultaneously with insertion of the IC module 4 having an adhesive layer 6 formed thereon into the hole for embedding the IC module, and the reinforcing sheet layer 8 and the oversheet 2b are superposed in this order. Under this state, hot pressing is performed (110° C., 25 kg/cm², 15 minutes), followed by punching out into a card size to complete an IC card. It is also possible to form a magnetic recording layer (not shown) on the oversheets 2a, 2b, if necessary.

For the IC card thus obtained, the bending test was conducted under the conditions shown below as determined by ISO by use of a bending tester produced by GAO.

Test conditions (1) Bending in the longer side direction of card:
Bent for 250 times at the rate of 30 times/min. each in the face direction and the back direction with a deflection amount of 2 cm.

(2) Bending in the shorter side direction of card:
Bent for 250 times at the rate of 30 times/min. each in the face direction and the back direction with a deflection amount of 1 cm.

As a result, the card of this example was found to be free from breaking or crack at the boundary portion between the IC module and the card substrate, and also of the IC module, thus exhibiting excellent performance without change in appearance, and also the actuations of reading and writing functioned normally.

EXAMPLE F-2 (THE SAME AS ABOVE)

Figure 30:
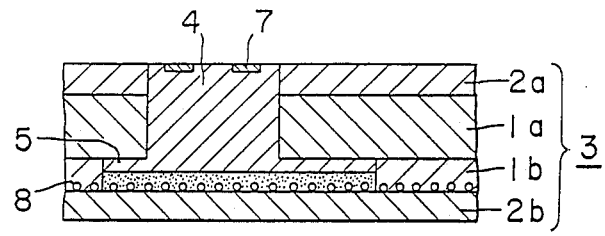

In this example, as shown in the cross-sectional view in FIG. 30, a reinforcing sheet layer 8 is formed by laying on the whole surface of an oversheet 2b. As the mesh material in this case, for example, Tetron mesh "T-120S" (120 mesh/inch; NBC Kogyo Co.) can be used. The card thickness in this case (including the module portion) is 0.78 to 0.80 mm.

The IC card thus obtained was found to be free from curl. Also, when evaluated according to the same method as Example F-1, there was no breaking or crack at the boundary portion between the IC module and the card substrate, and also without flying-out of the module. Thus, excellent performance was exhibited without change in appearance, and actuations of reading and writing also functioned normally.

EXAMPLE F-3 (THE SAME AS ABOVE)

Figure 31:
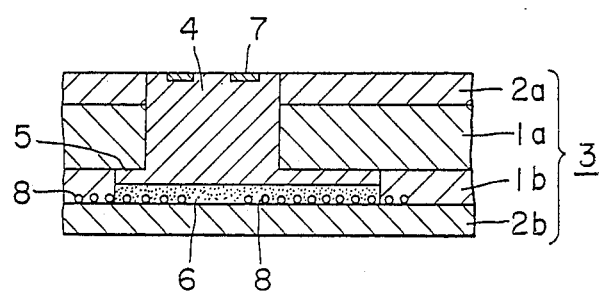
Figure 32:
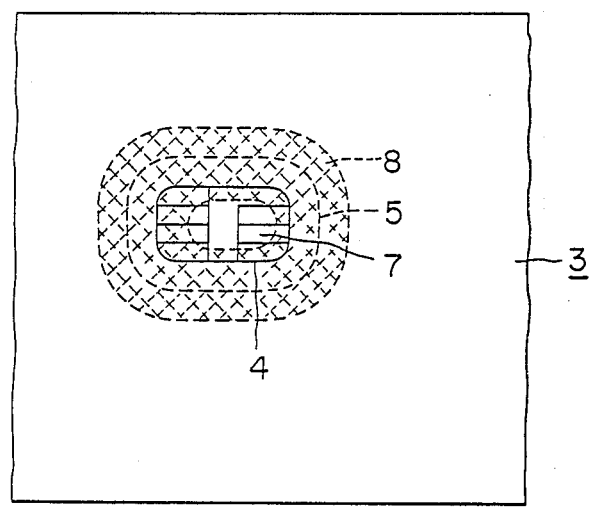

In this example, as shown in the cross-sectional view in FIG. 31 and the plan view in FIG. 32, a reinforcing sheet layer 8 is formed in shape of a sword guard so as to cover only the peripheral portion of the boundary between the IC module 4 and the center core 1b. As the mesh material in this case, nylon mesh "N-270T" (270 mesh/inch; NBC Kogyo Co.) can be used. The card thickness in this case (including the module portion is 0.70 to 0.81 mm.

As the result of evaluation according to the same method as Example F-1, excellent performance was exhibited without breaking or crack at the boundary portion between the IC module and the card substrate, without flying-out of the module or change in appearance. Actuations of reading and writing also functioned normally.

EXAMPLES F-4 TO F-7 (THE SAME AS ABOVE)

Figure 33:
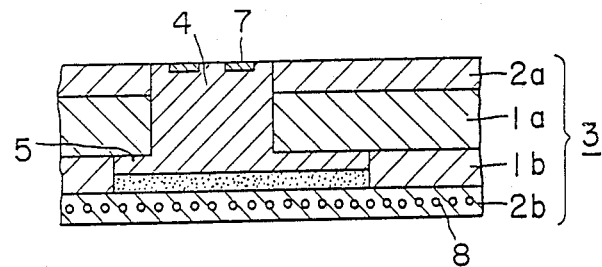

The IC card shown in FIG. 33 is an example in which a reinforcing sheet layer 8 is embedded in the oversheet 2b. Even in such an embodiment, sufficiently excellent reinforcing effect can be obtained.

Figure 34:
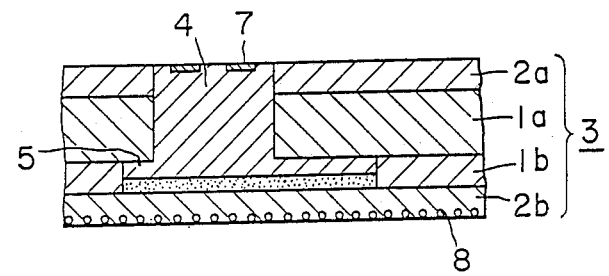

The IC card shown in FIG. 34 is an example in which a reinforcing sheet layer 8 is formed at the bottom of the oversheet 2b. In the case of producing an IC module of this embodiment, in the embodiment as shown in FIG. 28 as described above, the oversheet 2b and the reinforcing sheet layer 8 may be laminated in reverse order.

Figure 35:
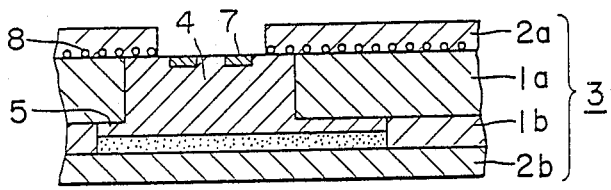

The IC card shown in FIG. 35 is a card of the type in which the oversheet 2a extends on the surface of the IC module 4 and only the terminal 7 for connection is exposed. In the case of such an IC card, it is also possible to form a reinforcing sheet layer 8 on the side of the oversheet 2a. In this case, the boundary portion between the IC module 4 and the center core 1a on the terminal 7 side is reinforced.

Figure 36:
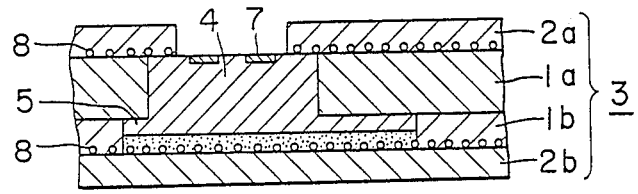

Although the portion of the external terminal 7 may be constructed as shown in FIG. 35 or FIG. 36 so that the external terminal 7 may be positioned in the recessed portion relative to the oversheet 2a, the advantage of (a) prevention of accumulation of dust at the external terminal portion and also (b) better running performance of the card when the IC card is subjected to reading/writing device can be obtained by forming the external terminal on the same plane as the oversheet 2a as shown in FIG. 33.

Also as shown in FIG. 36, it is possible to provide reinforcing sheet layers on both surfaces of the IC module.

Further, in FIG. 35 and FIG. 36, the reinforcing sheet layer 8 may be embedded internally of the oversheet as shown in FIG. 33 or FIG. 34, or alternatively at the surface portion of the oversheet.

EXAMPLE F-8 (THE SAME AS ABOVE)

The reinforcing sheet layer was formed in a porous metal sheet as shown below, and an IC card was prepared in the same manner as Example F-1.
Metal sheet: 30μ thick stainless steel film,
Hole pitch: 250μ,
Hole size: 250μ (diameter), prepared by etching method.

The IC card thus obtained was found to have a card thickness (including the module portion) of 0.78 to 0.80 mm.

EXAMPLE F-9 (THE SAME AS ABOVE)

Figure 37:
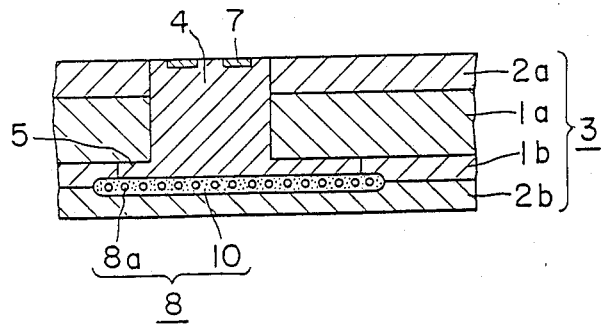

In this example, as shown in the cross-sectional view in FIG. 37, a reinforcing material comprising a mesh sheet 8a impregnated by coating with an adhesive layer 10 was used as the reinforcing sheet layer 8.

Such a reinforcing sheet layer can be obtained by coating, for example, polyester mesh "T-305S" (305 mesh/inch; NBC Kogyo Co.) with a nitrile rubber type adhesive by a dip coater at a proportion of 40 g/m² (dry state). The thickness in this case is about 60 μm. Otherwise, an IC card can be produced according to the same method as Example F-1.

Also, the above reinforcing sheet layer 8 is formed to have slightly greater area and shape than the module portion, as shown in this example.

Thus, since the reinforcing sheet layer 8 in this Example has also the function of an adhesive layer, the step for forming separately an adhesive layer at the bottom of the module can be advantageously omitted.

When the IC card thus obtained was evaluated according to the same method as Example F-1, there was no breaking or crack at the boundary portion between the IC module and the card substrate without flying-out of module or change in appearance. Thus, excellent performance was exhibited with normal functioning of reading and writing.

EXAMPLE F-10 (THE SAME AS ABOVE)

Figure 38:
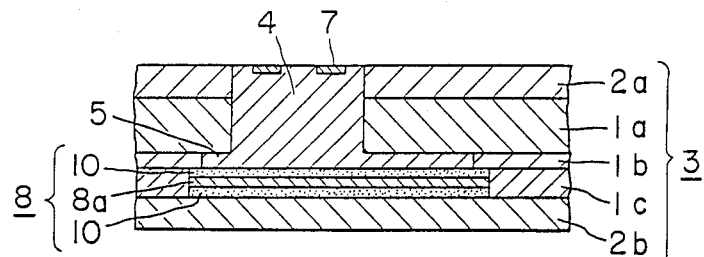

The reinforcing sheet layer 8 in this example is constituted of adhesive layers 10 on both surfaces of an unwoven fabric 8a as shown in FIG. 38.

As such a reinforcing sheet layer, for example, an unwoven fabric sheet substrate coated on both surfaces with a synthetic rubber type adhesive such as an adhesive sheet "M-5251" (90 μm thickness; produced by Nitto Denko Co.) can be used.

The IC card as shown in FIG. 38 can be prepared according to the method as described below.

First, at the predetermined portions of the center cores 1a, 1b, 1c applied with a desired printing and coated on both surfaces with an urethane type adhesive for lamination and the oversheet 2a, holes for embedding IC module are formed. Here, the hole provided at the center core 1b is formed so as to conform to the shape of the reinforcing member, and the hole provided at the center core 1c is formed so as to conform to the shape of the reinforcing sheet layer 8.

Next, the above oversheet 2a, center cores 1a, 1b, 1c are superposed in this order, and also the IC module 4 and the reinforcing sheet layer 8 are successively embedded in the holes, and hot pressing is performed under this state with the oversheet 2b being superposed thereon. Further, the composite is punched out into a card size to complete an IC card. It is also possible to form magnetic recording layers (not shown) on the oversheets 2a, 2b.

The reinforcing sheet layer in this example itself has also the function of an adhesive layer, and therefore the step of forming separately an adhesive layer at the bottom of the IC module can be advantageously omitted.

As the result of evaluation of the IC card thus obtained according to the method as Example F-1, there was no breaking or crack at the boundary portion between the IC module and the card substrate, no separation or falling off of the module and change in appearance of the card, thus exhibiting excellent performance with normal functioning of actuations such as reading and writing.

EXAMPLE F-11 (THE SAME AS ABOVE)

Figure 39:
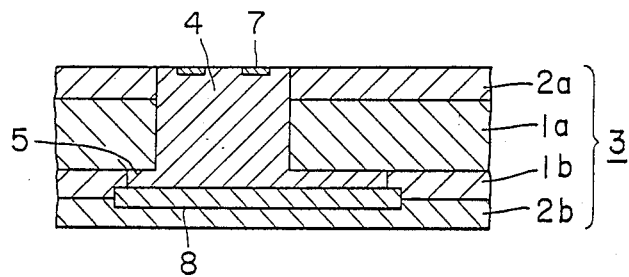

In this example, as shown in FIG. 39, the reinforcing sheet layer 8 is constituted of a rubbery adhesive sheet layer. Such an adhesive layer can be formed of, for example, a nitrile rubber type adhesive (e.g., "T-5300" (50 μm thickness; Nitto Denko Co.)). In this case, the reinforcing sheet layer has a thickness of about 0.05 mm, with the card thickness (including the module portion) being 0.78 to 0.82 mm.

The reinforcing sheet layer in this example itself has also the function of an adhesive layer, and therefore the step of forming separately an adhesive layer at the bottom of the IC module can be advantageously omitted.

Such an IC card can be prepared in the same manner as Example F-1.

It is also possible to form magnetic recording layers (not shown) on the oversheet 2a, 2b, if necessary.

EXAMPLE F-12 (THE SAME AS ABOVE)

Figure 40:
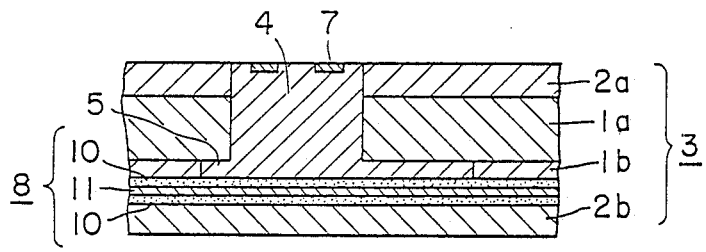

In this example, as shown in FIG. 40, the reinforcing sheet layer 8 is composed of an adhesive sheet comprising adhesive layers 10 on both surfaces of a plastic film base 11. Such an adhesive sheet may be, for example, one having a nitrile rubber type adhesive coated on both surfaces of a PET film base with a 12 μm thickness, e.g., "T-5330" (60 μm thickness; Nitto Denko Co.).

The reinforcing sheet layer in this example itself has also the function of an adhesive layer, and therefore the step of forming separately an adhesive layer at the bottom of the IC module can be advantageously omitted.

The IC card according to this example can be produced according to the same method as the above example F-1. The card thickness in this case including the module portion is 0.78 to 0.80 mm.

Also, the above reinforcing sheet layer 8 may be any of the embodiments shown in FIGS. 28~29, FIGS. 31~32 as described above, other than the embodiment laying over the whole card surface as in this example.

As the result of evaluation of the IC card thus obtained according to the method as Example F-1, there was no breaking or crack at the boundary portion between the IC module and the card substrate, no separation or falling off of the module and change in appearance of the card, thus exhibiting excellent performance with normal functioning of actuations such as reading and writing.

EXAMPLE F-13 (THE SAME AS ABOVE)

Figure 41:
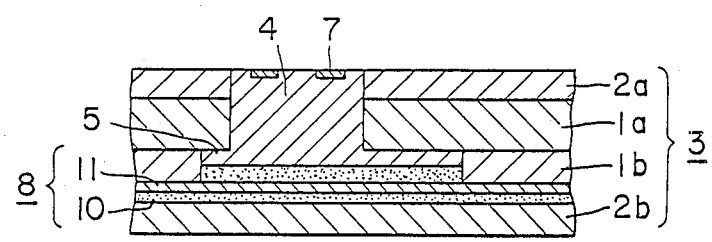

In this example, as shown in FIG. 41, the reinforcing sheet layer 8 is formed of an adhesive sheet having an adhesive layer 10 formed on one surface of a plastic film base 11. As such an adhesive sheet, for example, a PET film base with a thickness of 12 μm having a nitrile rubber type adhesive coated on one surface to a thickness of 30μ can be used.

Such an IC module can be prepared in the same manner as Example F-1. The card thickness in this case including the module portion is 0.78 to 0.82 mm.

Also, the above reinforcing sheet layer 8 may be any of the embodiments shown in FIGS. 28~29, FIGS. 31~32 as described above, other than the embodiment laying over the whole card surface as in this example.

As the result of evaluation of the IC card thus obtained according to the method as Example F-1, there was no breaking or crack at the boundary portion between the IC module and the card substrate, no separation or falling off of the module and change in appearance in the card, thus exhibiting excellent performance with normal functioning of actuations such as reading and writing.

EXAMPLE G-1 (PREPARED OF IC CARD)

The following examples G-1 to G-3 are examples in which specific images are formed on the surface of IC card according to the transfer method.

Figure 42:
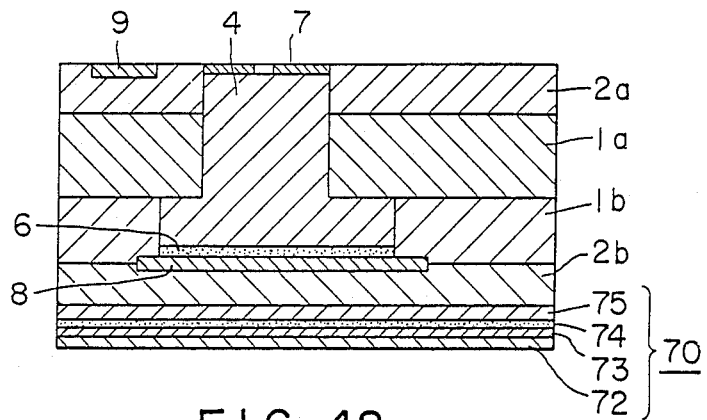
Figure 43:
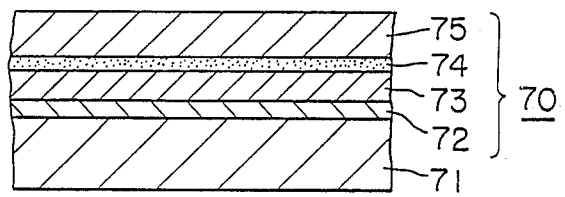
FIG. 43 is a sectional view of a transfer sheet.

The example shown in FIG. 42 is an example when a transfer layer 70 is formed on the backside surface of an IC card obtained according to the same method as the above examples F-1 to F-13. The transfer layer 70 can be formed by transfer at the same time when the IC card is integrated by hot press. The transfer sheet to be used at this time may consist of an OP layer (protective layer) 72 which also functions as a peeling layer, a printing layer 73, an anchor layer 74 and a colorant layer 75 which also functions as a heat seal layer laminated in this order on a transfer sheet substrate (e.g., PET film, 38 μm) 71.

In the case of the above example, by incorporating a desired metallic powder (Al, brass, etc.) the aesthetic characteristic in appearance of the IC card can be improved simultaneously with effective shielding of the IC module portion.

Also, practice of image formation on the IC card surface according to the transfer method a described above is advantageous in that distortions of picture patterns or letters liable to be generated in the vicinity of the IC module portion can be prevented.

Generally speaking, when a card is formed by embedding an IC module in the hole aranged in a card material comprising a vinyl chloride sheet, etc., followed by hot pressing, a phenomenon will inevitably occur that the substrate flows into a slight gap (around 0.1 mm) between the module and the arranged hole when the temperature of the substrate during heat pressing becomes its softening point (e.g., 50°~60° C.) or higher. In this case, when a picture pattern is printed on the surface of the substrate, this flows together with the softened substrate, whereby distortion occurs on the picture pattern. Whereas, according to the transfer system as described above, the printed layer to be transferred is retained on the transfer sheet substrate having high heat resistance, and therefore no distortion will occur on the printed layer even if the IC card substrate may be softened during heat pressing. Further, with this method, productivity as well as quality can be advantageously improved.

In this case, it is also possible to provide a printed layer (not shown) between the oversheet 2a and the core sheet 1a.

EXAMPLE G-2 (THE SAME AS ABOVE)

Figure 44:
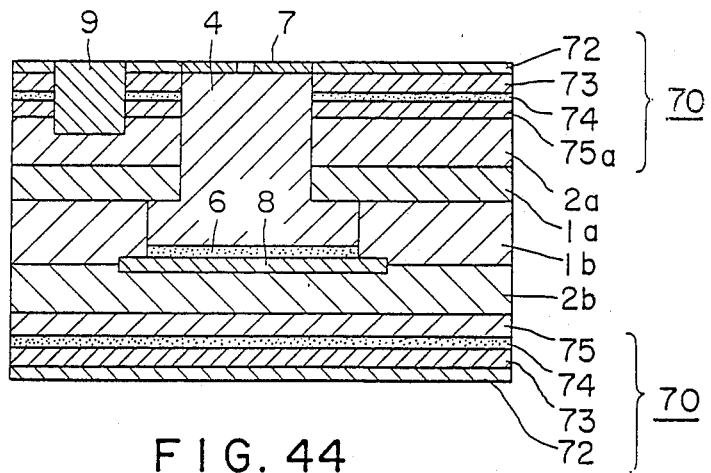

The example shown in FIG. 44 is an embodiment when a printed layer is formed also on the face side (terminal 7 side) of the IC card.

In this case, the colorant layer 75 is made white (containing titanium white), and the heat seal layer 75a is transparent. Other constitutions, and the preparation method are the same as in Example G-1.

In the case of this example, since a printed layer is provided according to the transfer method on the surface on the face side of the IC card, productivity as well as quality can be advantageously improved. Further, a printed layer can be easily formed on the surface of the IC module (except for the contact portion). In the prior art, when a printed layer is provided on the face side, it has been provided between the oversheet 2a and the center core 1a. However, according to this method, there is the problem that peel-off is liable to occur between the oversheet and the center core (due to bad adhesion of ink with substrate). On the other hand, when printing is applied on the surface of the oversheet 2a, there is the problem with respect to productivity. In this example, by provision of a printed layer according to the transfer method by use of a transfer (L>sheet having the above construction, such problems can be cancelled.

Also, if necessary, it is possible to form a magnetic recording layer 9.

In the above example G-1 and this example, the OP layer 72 and the anchor layer 74 may be optionally formed, or they can be omitted. Also, the heat seal layer (colorant layer) 75 may be colored in a desired color (white, gold, silver, transparent, etc.). It may also be a laminate of a transparent heat seal layer and a colorant layer.

EXAMPLE H-1 (PREPARATION OF IC CARD)

As shown in the cross-sectional view in FIG. 1B, the IC card according to this example has an IC module 4 arranged through an adhesive layer 6 in the card substrate 3 comprising a laminate of the center cores 1a, 1b and the oversheets 2a, 2b. The symbol 7 is a terminal for electrical connection to external device. And, in this example, a reinforcing sheet layer 8 comprising a mesh of a network-shaped sheet (e.g., polyester mesh "T-270T" (270 mesh/inch; NBC Kogyo Co.) is formed by laying between the center core 1 and the oversheet 2b.

As shown in FIG. 1B, in this Example, the IC module 4 has no reinforcing member, but a reinforcing sheet layer 8 having slightly greater area and shape than the IC module 4 is laid. The card thickness (including the module portion) in this case is 0.79 to 0.81 mm.

Next, the method for preparation of the IC card according to the above example is to be explained.

First, holes for embedding the IC card are formed at the predetermined portions of the center cores 1 and the oversheet 2a. The center core 1 is coated on both surfaces with an urethane type adhesive for lamination by roll coating method, gravure coating method, etc. Here, the hole provided at the center core 1 and the oversheet 2a is formed corresponding to the shape of the IC module.

Next, the oversheet 2a, the center cores 1 are superposed in this order, simultaneously with insertion of the IC module 4 having an adhesive layer 6 formed thereon into the hole for embedding the IC module, and the reinforcing sheet layer 8 and the oversheet 2b are superposed in this order. Under this state, hot pressing is performed (110° C., 25 kg/cm$^2$, 15 minutes), followed by punching out into a card size to complete an IC card. It is also possible to form a magnetic recording layer (not shown) on the oversheets 2a, 2b, if necessary.

For the IC card thus obtained, the bending test was conducted under the conditions shown below as determined by ISO by use of a bending tester produced by GAO.

TEST CONDITIONS (1) Bending in the longer side direction of card:
Bent for 250 times at the rate of 30 times/min. each in the face direction and the back direction with a deflection amount of 2 cm, (2) Bending in the shorter side direction of card:
Bent for 250 times at the rate of 30 times/min. each in the face direction and the back direction with a deflection amount of 1 cm.

As a result, the card of this example was found to be free from breaking or crack at the boundary portion between the IC module and the card substrate, and also without drop-off of the IC module, thus exhibiting excellent performance without change in appearance, and also the actuations of reading and writing functioned normally.

EXAMPLE H-2 (PREPARATION OF IC CARD)

As shown in the cross-sectional view in FIG. 1C, the IC card according to this example has an IC module 4 arranged through an adhesive layer 6 in the card substrate 3 comprising a laminate of the center cores 1a, 1b and the oversheets 2a, 2b. The symbol 7 is a terminal for electrical connection to external device. In this example, as shown in FIG. 1C, the IC module 4 has a reinforcing member 5.

Next, the method for preparation of the IC card according to the above example is to be explained.

First, holes for embedding the IC card are formed at the predetermined portions of the center cores 1a, 1b and the oversheet 2a. The center cores 1a and 1b are coated on both surfaces with an urethane type adhesive for lamination by roll coating method, gravure coating method, etc. Here, the hole provided at the center core 1b is formed corresponding to the shape of the reinforcing member 5.

Next, the oversheet 2a, the center cores 1a, 1b are superposed in this order, simultaneously with insertion of the IC module 4 having an adhesive layer 6 formed thereon into the hole for embedding the IC module, and the oversheet 2b are superposed in this order. Under this state, hot pressing is performed (110° C., 25 kg/cm², 15 minutes), followed by punching out into a card size to complete an IC card. It is also possible to form a magnetic recording layer (not shown) on the oversheets 2a, 2b if necessary.

Thus obtained IC card of this example was found to be free from breaking or crack at the boundary portion between the IC module and the card substrate, and also without drop-off of the IC module, thus exhibiting excellent performance without change in appearance, and also the actuations of reading and writing functioned normally.

What is claimed is:

1. An IC card comprising an IC module embedded in an IC module substrate built in a card substrate, said IC module comprising an IC chip, a circuit substrate and a reinforcing member, said reinforcing member comprising at least a part of the side portion of said IC module substrate extended in the outer circumferential direction, wherein said reinforcing member is formed in a shape so that it has a greater area toward the portion of the IC card with a greater flex coefficient.

2. An IC card according to claim 1, wherein a reinforcing sheet layer is laid in the planar direction of the card so as to cover at least the peripheral portion of the boundary between the card substrate and the IC module.

3. An IC card according to claim 1, wherein the sealing frame layer and/or the resin for mold constituting the IC module have/has a color identical or similar to that of a card substrate.

4. An IC card according to claim 1, wherein the IC module is applied with smoothening working on the backside thereof.

5. An IC card according to claim 1, wherein said IC module is an IC module having an IC chip mounted in a laminate of a plurality of substrates for formation of the IC module, at least one layer of said substrates for formation of the IC module has a reinforcing member extended in the outer circumferential direction of the IC module, and said reinforcing member is provided as extended so as to form a difference in level from the intermediate portion of said substrate for formation of the I module.

6. An IC card according to claim 1, wherein said IC module comprises two or more IC chips mounted thereon, and the sealing frame layer forming the IC module has windows with shapes for permitting said respective IC chips to extend therethrough independently of each other.

7. An IC card according to claim 1, wherein an external terminal of the IC module is formed on the same plane as the surface of the card substrate.

8. An IC card according to claim 2, wherein the reinforcing sheet layer is formed of at least one material selected from the group consisting of mesh-like sheet, unwoven fabric, continuous body sheet, rubber sheet, thermoplastice elastomer sheet, rubbery adhesive layer and tacky sheet.

9. An IC card according to claim 2, wherein the reinforcing sheet layer comprises an adhesive sheet having a polyolefinic adhesive layer formed on both surfaces of a plastic film.

10. An IC card according to claim 2, wherein the reinforcing sheet layer has a color identical or similar to that of the card substrate.

11. An IC card according to claim 2, wherein the reinforcing sheet layer comprises an opaque white material.

12. An IC card according to claim 1, wherein the oversheet constituting the IC card is opaque white.

13. An IC card according to claim 1, wherein the card substrate is constituted with the oversheet having microindentations formed on one surface or both surfaces thereof.

14. An IC card according to claim 1, wherein the card substrate is constituted with the oversheet in which a mesh sheet is laid therein.

15. An IC card comprising an IC module embedded in a card substrate,
said IC card having a mesh sheet as a reinforcing sheet layer laid in the planar direction of the card so as to cover at least the peripheral portion of the boundary between the card substrate and the IC module;
said IC module having an IC chip mounted in a laminate of a plurality of substrates for formation of the IC module, at least one layer of said substrates for formation of the IC module having a reinforcing member extended in the outer circumferential direction of the IC module; and
said reinforcing member being formed in a shape so that it has a greater area toward the portion of the IC card with greater flex coefficient.

16. An IC module to be mounted in an IC card and embedded in an IC module substrate, said IC module comprising an IC chip, a circuit substrate and a reinforcing member, said reinforcing member comprising at least a art of the side portion of said IC module substrate extended in the outer circumferential direction, wherein said reinforcing member is formed in a shape so that it has a greater area toward the portion of the IC card with greater flex coefficient.

17. An IC module according to claim 16, wherein the IC module is applied with smoothening working on the backside thereof.

18. An IC module according to claim 16, wherein said IC module is an IC module having an IC chip mounted in a laminate of a plurality of substrates for formation of the IC module, at least one layer of said substrates for formation of the IC module has a reinforcing member extended in the outer circumferential direction of the IC module, and said reinforcing member is provided as extended so as to form a difference in level from the intermediate portion of said substrate for formation of the IC module.

19. An IC module according to claim 16 wherein said IC module comprises two or more IC chips mounted thereon, and the sealing frame layer forming the IC module has windows with shapes for permitting said respective IC chips to extend therethrough independently of each other.

20. An IC module according to claim 16, wherein said IC module has a color identical or similar to that of a card substrate in which said IC module is built.

21. An IC card according to claim 15, wherein said reinforcing member is provided as extended so as to form a difference in level from the intermediate portion of said substrate for formation of the IC module.

22. An IC card according to claim 21, wherein said IC module is applied with smoothening working on the backside thereof.

* * * * *